(12) United States Patent
Quick et al.

(10) Patent No.: US 10,651,375 B2
(45) Date of Patent: May 12, 2020

(54) MEMORY CELLS, SEMICONDUCTOR DEVICES INCLUDING THE MEMORY CELLS, AND METHODS OF OPERATION

(71) Applicant: Micron Technology, Inc., Boise, ID (US)

(72) Inventors: Timothy A. Quick, Boise, ID (US); Eugene P. Marsh, El Granada, CA (US); Stefan Uhlenbrock, Boise, ID (US); Chet E. Carter, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/160,518

(22) Filed: Oct. 15, 2018

(65) Prior Publication Data
US 2019/0051823 A1 Feb. 14, 2019

Related U.S. Application Data

(63) Continuation of application No. 15/915,861, filed on Mar. 8, 2018, now Pat. No. 10,283,705, which is a continuation of application No. 14/677,571, filed on Apr. 2, 2015, now Pat. No. 9,935,264, which is a continuation of application No. 13/298,987, filed on Nov. 17, 2011, now Pat. No. 9,006,075.

(51) Int. Cl.
*H01L 45/00* (2006.01)

(52) U.S. Cl.
CPC ........ *H01L 45/085* (2013.01); *H01L 45/1233* (2013.01); *H01L 45/141* (2013.01); *H01L 45/1608* (2013.01); *H01L 45/1616* (2013.01)

(58) Field of Classification Search
CPC ... H01L 45/85; H01L 45/1675; H01L 45/143; H01L 45/1658; H01L 45/1233; H01L 45/1653
See application file for complete search history.

(56) References Cited

U.S. PATENT DOCUMENTS

| | | | |
|---|---|---|---|
| 5,761,115 A | 6/1998 | Kozicki et al. | |
| 5,914,893 A | 6/1999 | Kozicki et al. | |
| 6,084,796 A | 7/2000 | Kozicki et al. | |
| 6,355,561 B1 | 3/2002 | Sandhu et al. | |
| 6,559,472 B2 | 5/2003 | Sandhu et al. | |
| 6,576,053 B1 * | 6/2003 | Kim | C30B 25/02 117/89 |
| 6,768,157 B2 * | 7/2004 | Krieger | B82Y 10/00 257/314 |

(Continued)

OTHER PUBLICATIONS

Steiner et al., Temperature Induced Recrystallization of Copper Coatings Deposited on Adhesion Promoting Molybdenum Interlayers, Journal of Physics: Conference Series vol. 100 (2008) 4 pages.

(Continued)

*Primary Examiner* — Kyoung Lee
*Assistant Examiner* — Christina A Sylvia
(74) *Attorney, Agent, or Firm* — TraskBritt

(57) ABSTRACT

Memory cells are disclosed, which cells include a cell material and an ion-source material over the cell material. A discontinuous interfacial material is included between the cell material and the ion-source material. Also disclosed are fabrication methods and semiconductor devices including the disclosed memory cells.

22 Claims, 15 Drawing Sheets

(56) References Cited

U.S. PATENT DOCUMENTS

| | | |
|---|---|---|
| 6,858,482 B2 * | 2/2005 | Gilton ................. G11C 13/0011 |
| | | 257/E27.004 |
| 6,949,827 B2 | 9/2005 | Sandhu et al. |
| 6,951,805 B2 | 10/2005 | Moore |
| 7,115,992 B2 | 10/2006 | Moore et al. |
| 7,368,314 B2 | 5/2008 | Ufert |
| 7,479,650 B2 | 1/2009 | Gilton |
| 7,658,773 B2 | 2/2010 | Pinnow |
| 8,981,334 B1 | 3/2015 | Schubert et al. |
| 9,583,703 B2 | 2/2017 | Campbell |
| 2002/0115252 A1 | 8/2002 | Haukka et al. |
| 2003/0211649 A1 | 11/2003 | Hirai et al. |
| 2004/0099885 A1 | 5/2004 | Yeo et al. |
| 2006/0139989 A1 | 6/2006 | Gruning et al. |
| 2007/0001238 A1 | 1/2007 | Koyama et al. |
| 2009/0218567 A1 * | 9/2009 | Mathew ................. H01L 45/085 |
| | | 257/52 |
| 2010/0163829 A1 | 7/2010 | Wang et al. |
| 2010/0193758 A1 | 8/2010 | Tian et al. |
| 2011/0031459 A1 | 2/2011 | Kubo et al. |
| 2011/0180775 A1 * | 7/2011 | Lin ....................... H01L 45/085 |
| | | 257/4 |
| 2013/0128649 A1 * | 5/2013 | Quick ................... H01L 45/085 |
| | | 365/148 |
| 2015/0214477 A1 | 7/2015 | Quick et al. |

OTHER PUBLICATIONS

Kozicki et al., Non-Volatile Memory Based on Solid Electrolytes, Non-Volatile Memory Technology Symposium (2004) pp. 10-17.

Katz, Adhesion of Copper Films to Aluminum Oxide Using a Spinel Structure Interface, Thin Solid Films, vol. 33 (1976) pp. 99-105.

Gupta, T., Copper Interconnect Technology, Springer Science & Business Media, XIV, (2009), p. 71.

* cited by examiner

MEMORY CELLS, SEMICONDUCTOR DEVICES INCLUDING THE MEMORY CELLS, AND METHODS OF OPERATION

CROSS-REFERENCE TO RELATED APPLICATIONS

This application is a continuation of U.S. patent application Ser. No. 15/915,861, filed Mar. 8, 2018, now U.S. Pat. No. 10,283,705, issued May 7 2019, which is a continuation of U.S. patent application Ser. No. 14/677,571, filed Apr. 2, 2015, now U.S. Pat. No. 9,935,264, issued Apr. 3, 2018, which is a continuation of U.S. patent application Ser. No. 13/298,987, filed Nov. 17, 2011, now U.S. Pat. No. 9,006,075, issued Apr. 14, 2015, the disclosure of each of which is hereby incorporated herein in its entirety by this reference.

TECHNICAL FIELD

The present disclosure, in various embodiments, relates generally to the field of memory device design and fabrication. More particularly, the present disclosure relates to design and fabrication of memory cells including a discontinuous interfacial material between a cell material and an ion-source material of the memory cell, methods of fabricating the memory cells, and semiconductor devices including the memory cells.

BACKGROUND

Conventional memory cells used in binary systems are configured to be selectively switchable between a condition readable as associated with the value "0" and a condition readable as associated with the value "1." For example, a conductive-bridging random access memory (conductive bridge RAM) cell, also known in the industry as a programmable metallization cell (PMC), is generally configured such that application of a voltage to the cell eventually causes a first and a second electrode of the cell to become short circuited such that the measurable electrical resistance of the cell significantly drops. The short circuit is accomplished by forming a conductive bridge, also known in the industry as a conductive pathway, to electroconductively connect the two electrodes. When no conductive bridge is present, the memory cell has high electrical resistance and may read as "0." When the conductive bridge electroconductively connects the two electrodes, the resistance of the cell is low, and the memory cell may read as "1."

The conductive bridge, which is also referred to in the art as a "filament," is selectively formed or removed by the selective application of voltage to the cell. The conductive bridge generally forms between a negatively-charged electrode and a positively-charged electrode. Therefore, adjusting the voltage applied to the first and second electrodes controls the growth or growth-reversal of the conductive bridge. It is believed that the conductive bridge grows by precipitation of cations (e.g., metal cations) that drift, when under the influence of an applied voltage, through materials separating the first and second electrodes, provided such materials accommodate drift of the cations.

Conventional memory cells, including conductive bridge RAM cells, incorporate multiple components formed from various materials. In forming the materials, sufficient adhesive strength between materials is needed to maintain film stack integrity. If one material to be formed on another material does not exhibit sufficient adhesion with the another material, adhesion enhancement may be needed. For example, a metal-containing material, such as copper, used to form an electrode in a conductive bridge RAM cell may not sufficiently adhere with an overlying cell material, such as a dielectric material. Therefore, forming a conductive bridge RAM cell with sufficient film stack integrity may include enhancement of adhesion between the copper-containing electrode and the cell material. However, conventional methods for enhancing adhesion between materials are not necessarily conducive for use in fabricating memory cells in which atoms drift during operation. For example, conventional adhesion-enhancing films, formed between two materials to increase adhesion between the two materials, may present a barrier to atomic drift. As such, a difficulty of fabricating conductive bridge RAM cells, and other memory cells in which atoms drift between materials during operation, is achieving sufficient adhesion between materials without significantly obstructing drift of atoms between the materials.

DETAILED DESCRIPTION

Figure 1:
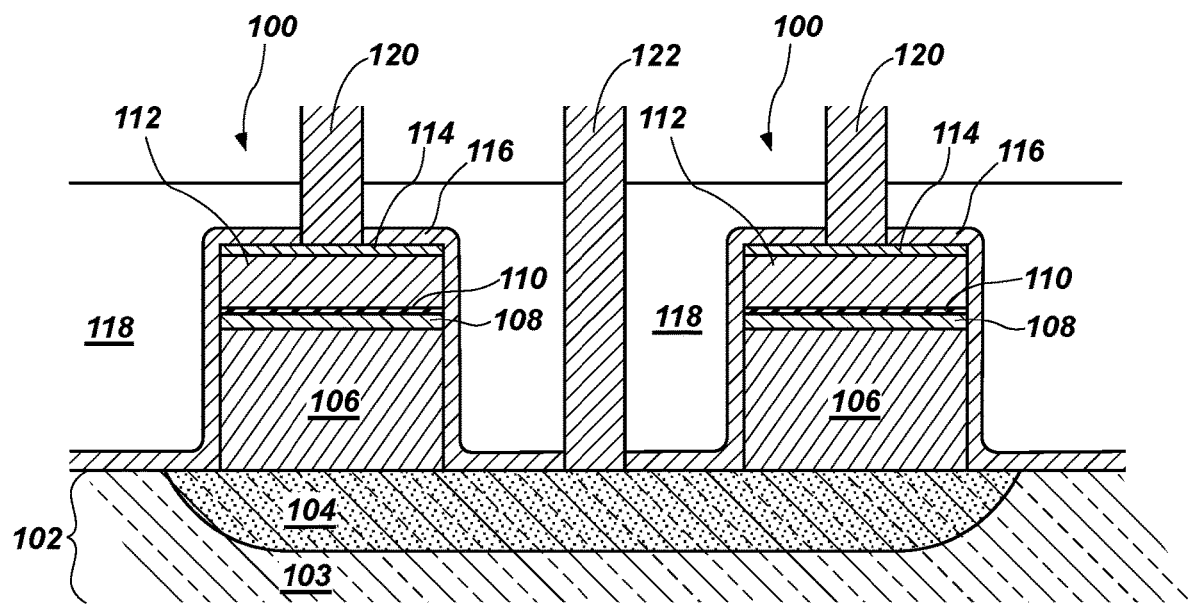
FIG. 1 is a cross-sectional, front elevation, schematic view of memory cells of an embodiment of the present disclosure.

Memory cells, semiconductor devices including such cells, and methods for fabrication of such cells are disclosed. The memory cells include a discontinuous interfacial material between a first material, such as a cell material, and an ion-source material, such as a copper-containing material or a silver-containing material. The discontinuous interfacial material includes a plurality of interfacial complexes that are spaced apart from one another. Since the interfacial material is discontinuous, the interfacial material is permeable to atoms (i.e., does not hinder the drift of atoms through the interfacial material). Each interfacial complex is chemisorbed to the cell material and is bonded to at least one atom from the ion-source material. A first and a second electrode may be in operative communication with the cell material and the ion-source material, respectively. When under the influence of an applied voltage, atoms, such as metal ions, from the ion-source material may drift through the discontinuous interfacial material, passing between neighboring interfacial complexes, and may form a filament electroconductively connecting the first electrode and the second electrode. The discontinuous interfacial material provides sufficient adhesive strength between the cell material and the ion-source material to maintain integrity of the cell stack without preventing or reducing the drift of atoms from the ion-source material.

As used herein, the term "substrate" means and includes a base material or construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x may be, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, "adherent atom" means and refers to an atom formulated to chemisorb to a first material, such as a cell dielectric or other cell material. One or more ligands, which are not formulated to chemisorb to the first material, may be bonded to the adherent atom. In some embodiments, the adherent atom may be a centralized atom to which ligands are bonded. In other embodiments, the adherent atom may be bonded to a central atom to which other adherent atoms or non-adherent atoms (e.g., ligands) are also bonded. Accordingly, the "adherent atom" of a molecule may not necessarily be positioned central to the molecule containing the adherent atom, and the molecule containing the adherent atom does not necessarily contain only one adherent atom.

As used herein, "ligands" refers to an atom or group of atoms bonded to an adherent atom or disassociated from an adherent atom wherein the atom or groups of atoms are not formulated to chemisorb to the first material. Therefore, an atomic group known as a "ligand" in the conventional sense may or may not be a "ligand" according to the present disclosure.

As used herein, "chemisorption" refers to chemical adsorption of a vaporized reactive compound on the surface of a material within or supported by a substrate. The adsorbed species are bound to the substrate or material surface at reaction surface sites.

As used herein, the term "chemisorb" means and includes forming a chemical linkage or bond between a chemical species and another chemical species, such as a substrate or cell material. A species described as being "chemisorbed," as used herein, means and includes a chemical species chemically linked or bonded to atoms within the another chemical species.

As used herein, "monolayer" means and includes a material formed of a single thickness of atoms or molecules.

As used herein, "partial monolayer" means and includes a material formed of a single thickness of atoms or molecules that is not continuous in material coverage. Therefore, segments of a partial monolayer of atoms or molecules may be void of atoms or molecules.

As used herein, "continuous monolayer" means and includes a material formed of a single thickness of atoms or molecules that is continuous in material coverage.

As used herein, "at least partial monolayer" includes both a partial monolayer, as defined above, and a continuous monolayer, as defined above.

As used herein, "saturated" means and includes a continuous monolayer of a material in which substantially all available reaction surface sites occupiable by atoms or molecules of the material are so occupied.

As used herein, "non-saturated" means and includes a partial monolayer of material in which a substantial number of available reaction surface sites, occupiable by atoms or molecules of the material, are not occupied.

As used herein, the terms "first," "second," "third," etc., may describe various elements, components, regions, materials, and/or sections, none of which are limited by these terms. These terms are used only to distinguish one element, component, region, material, or section from another element, component, region, material, or section. Thus, "a first element," "a first component," "a first region," "a first material," or "a first section" discussed below could be termed a second element, a second component, a second region, a second material, or second section without departing from the teachings herein.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the materials in addition to the orientation depicted in the figures. For example, if materials in the figures are turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular atom, molecule, material, component, structure, device, or system, but are merely idealized representations that are employed to describe embodiments of the present disclosure.

Embodiments are described herein with reference to the illustrations. Variations from the shapes of the illustrations, as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box shaped may have rough and/or nonlinear features. Moreover, sharp angles that are illustrated may be rounded. Thus, the regions illustrated in the figures are schematic in nature, and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

The terms "atomic layer deposition" and "ALD," as used herein, includes atomic layer epitaxy (ALE), molecular beam epitaxy (MBE), gas source MBE, organometallic MBE, and chemical beam epitaxy when performed with alternating pulses of precursor compound(s), reaction gas(es), and purge (i.e., inert) gas.

Unless the context indicates otherwise, the removal of materials from a tool or chamber described herein may be accomplished by any suitable technique including, but not limited to, inert gas purge, chamber gas evacuation, chemical reaction, or other known methods.

Reference will now be made to the drawings, where like numerals refer to like components throughout. The drawings are not necessarily drawn to scale.

A memory cell is disclosed. The memory cell may be a conductive-bridging random access memory (conductive bridge RAM) cell. The memory cell includes a first electrode, a cell material over the first electrode, an ion-source material over the cell material, and a second electrode over the ion-source material. The memory cell also includes a discontinuous interfacial material between the cell material and the ion-source material. The discontinuous interfacial material is configured to provide adhesion of the ion-source material to the cell structure without prohibiting atom (e.g., ion) drift. When under the influence of an applied voltage, metal atoms within the ion-source material are oxidized at a surface of the ion-source material, drift through the discontinuous interfacial material and cell material, and are reduced at a surface of the first electrode, forming an electro-deposit. Once the electro-deposit, or filament, grows to bridge the two electrodes, or, alternatively, to bridge the first electrode and the ion-source material, the memory state of the cell switches from a high resistance (off) state to a low resistance (on) state.

FIG. 1 schematically depicts an embodiment of a pair of memory cells 100 of the present disclosure. A substrate 102 supports the memory cells 100. The substrate 102 includes a semiconductor base material 103. The substrate 102 may further include a doped (e.g., n$^+$) conductive region 104.

A first electrode 106 is in contact with the conductive region 104 of the substrate 102. The first electrode 106 may include more than one material, e.g., stacked or mixed materials. The first electrode 106 may be formed of a metal, for example and without limitation, tungsten.

A cell material 108 is formed over the first electrode 106. The cell material 108 may be a cell dielectric material including an oxide, for example and without limitation, a transition metal oxide, e.g., hafnium oxide. A dielectric cell material 108 may additionally or alternatively include silicates, oxy-nitrides, conventional high k dielectric materials, or combinations thereof. The cell material 108 may include a semi-conductive chalcogenide solid-electrolyte. The cell material 108 may include more than one material, e.g., stacked or mixed materials. The cell material 108 may be permeable to drifting of atoms from the ion-source material.

Figure 2:
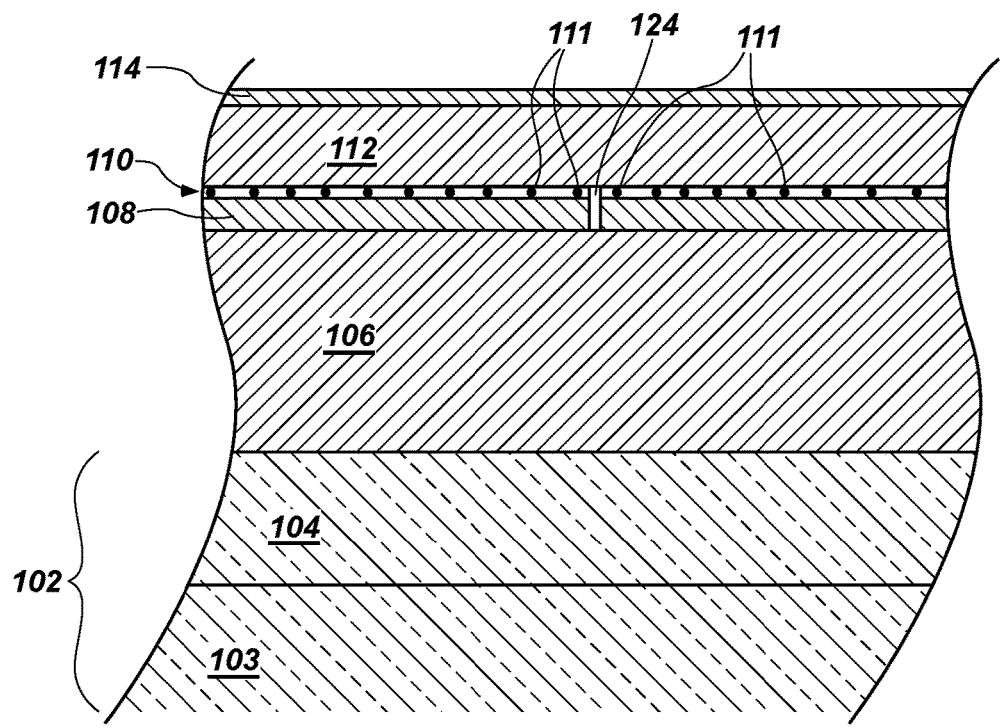
FIG. 2 is a partial, cross-sectional, front elevation, schematic view of a portion of a memory cell of FIG. 1.

As shown in FIG. 1 and in enlarged view in FIG. 2, an interfacial material 110 is formed over the cell material 108. The interfacial material 110 includes a plurality of interfacial complexes that are spaced apart from one another. Thus, the interfacial material 110 forms a discontinuous interface between the cell material 108 and an ion-source material 112.

The interfacial complexes include an adherent atom 111 adsorbed to the cell material 108 and an atom bonded to at least one atom of the ion-source material 112. Thus, the interfacial material 110 is configured to provide adhesion between the cell material 108 and the ion-source material 112.

In some embodiments, the atom of the interfacial complex bonded to at least one atom of the ion-source material 112 is the adherent atom 111, such that the adherent atom 111 is adsorbed to the cell material 108 and is bonded to at least one atom of the ion-source material 112. In other embodiments, the atom bonded to the at least one atom of the ion-source material 112 is not the adherent atom 111, but another atom of the interfacial complex. In some such embodiments, therefore, the adherent atom 111 is adsorbed to the cell material 108, and the adherent atom 111 is bonded to another atom that is bonded to at least one atom of the ion-source material 112.

The atom of the ion-source material 112 to which an atom of the interfacial complex is bonded may be a metal atom, such as a copper or silver atom. In some such embodiments, not every interfacial metal atom within the ion-source material 112 is bonded to an adherent atom 111 within the interfacial material 110. In some such embodiments, metal atoms derived from the ion-source material 112 may be positioned between the interfacial complexes of the interfacial material 110.

The adherent atoms 111 of the interfacial material 110 may be atoms of elements configured to be bonded with metal atoms within the ion-source material 112 and formulated to be adsorbed to the cell material 108. The adherent atoms 111 of the interfacial material 110 may include atoms of elements conventionally used in copper or silver diffusion barriers. Alternatively, the adherent atoms 111 of the interfacial material 110 may include atoms of other elements that enable drift of copper or silver ions therethrough. The adherent atoms 111 may be metal atoms that are configured to chemisorb (e.g., bond) with the cell material 108. The adherent atoms 111 of the interfacial material 110 may be atoms of Group 4 elements of the Periodic Table of the Elements (i.e., titanium, zirconium, or hafnium), Group 5 elements of the Periodic Table of the Elements (i.e., vanadium, niobium, or tantalum), Group 6 elements of the Periodic Table of the Elements (i.e., chromium, molybdenum, or tungsten), aluminum, germanium, tellurium, cobalt, silicon, sulfur, carbon, oxygen, nitrogen, compounds thereof, or derivatives thereof. In one embodiment, the adherent atoms 111 of the interfacial material 110 are aluminum atoms.

The interfacial material 110 is discontinuous in that the adherent atoms 111 and, therefore, the interfacial complexes are spaced apart from other adherent atoms 111 and interfacial complexes, respectively. The interfacial material 110 may have a thickness of only one adherent atom 111 or one interfacial complex and may, therefore, form a partial monolayer of the plurality of adherent atoms 111 or interfacial complexes, respectively. The interfacial material 110 is discontinuous such that the interfacial material 110 covers a portion of the cell material 108. The interfacial material 110 may cover less than about 60% of the total available surface area defined by the cell material 108. The interfacial material 110 may cover less than about 50% of the total available surface area of the cell material 108, e.g., about 40% of the total available surface area.

The adherent atoms 111 and therefore the interfacial complexes may be spaced apart by a distance sufficient to accommodate the diameter of a metal ion derived from the ion-source material 112. In other words, the diameter of metal atoms of the ion-source material 112 may be smaller than the distance between adjacent adherent atoms 111, enabling metal atoms (e.g., metal ions) to drift through the interfacial material 110. Accordingly, where the ion-source material 112 includes copper, the adherent atoms 111 and therefore the interfacial complexes within the interfacial material 110 may be spaced apart by a distance greater than about 290 picometres, enabling copper ions to drift through the interfacial material 110. Where the ion-source material 112 includes silver, the adherent atoms 111 and therefore the interfacial complexes within the interfacial material 110 may be spaced by a distance greater than 330 picometres, enabling silver ions to drift through the interfacial material 110.

With further reference to FIG. 1, the ion-source material 112 is formed over the interfacial material 110 and the cell material 108. The ion-source material may include at least one metal from Group 11 of the Periodic Table of the Elements (e.g., copper, silver, or both). The ion-source material 112 is formulated such that application of energy to the memory cell 100 oxidizes a portion of atoms within the ion-source material 112 and causes atoms (e.g., ions) to drift from the ion-source material 112 into the cell material 108.

In some embodiments, a second electrode 114 is formed over the ion-source material 112. The second electrode 114 may include more than one material, e.g., stacked or mixed materials. The second electrode 114 may be formed of a metal, for example and without limitation, copper or silver. In other embodiments, additional materials may be formed over the ion-source material 112. For example, materials formulated to provide current rectification may be formed over the ion-source material 112. Such current rectifiers may include a diode access device.

In some embodiments, the stack of the first electrode 106, the cell material 108, the interfacial material 110, the ion-source material 112, and the second electrode 114 may be oriented as illustrated in FIG. 1. In other embodiments, this cell stack may be inverted.

The stack of the first electrode 106, the cell material 108, the interfacial material 110, the ion-source material 112, and the second electrode 114 may be covered by a liner 116 of insulating material. The material of the liner 116 may serve as a diffusion barrier to prevent or inhibit atoms from the ion-source material 112 (and potentially from the second electrode 114) from diffusing away from the memory cell 100 and into other areas of a semiconductor device incorporating the memory cell 100. The liner 116 may be formed of, for example and without limitation, silicon nitride and may conform to sidewalls of the first electrode 106, the cell material 108, the ion-source material 112, and the second electrode 114.

Insulator material 118 may fill space between the memory cells 100. The insulator material 118 may be formed of, for example and without limitation, silicon oxide or other conventional insulator material. A first contact 120 operatively connects the second electrode 114 with other components of the semiconductor device incorporating the memory cell 100. Likewise, a second contact 122 operatively connects, via the conductive region 104 of the substrate 102, the first electrode 106 with other components of the semiconductor device incorporating the memory cell 100. The first contact 120 and the second contact 122 are configured to accommodate applying or removing a voltage to the memory cell 100.

The first electrode 106, cell material 108, second electrode 114, liner 116, insulator material 118, first contact 120, second contact 122, and other components of the memory cells 100 may be formed by conventional techniques, which are not described in detail herein.

With further reference to FIG. 2, shown is an enlarged view of a portion of one of the memory cells 100 of FIG. 1. FIG. 2 depicts the portion during use and operation of the memory cell 100. In operation, a voltage may be applied to the memory cell 100 via either or both of the first contact 120 (FIG. 1) and the second contact 122 (FIG. 1). Applying the voltage results in one or more conductive pathways, e.g., a conductive filament 124, forming (e.g., growing) to electroconductively connect the first electrode 106 and the second electrode 114. The filament 124 may grow to bridge between the ion-source material 112 and a surface of the first electrode 106. The growth of the conductive pathway(s) depends upon the applied voltage and application time. Low voltages cause slow growth of conductive pathway(s), whereas higher voltages result in faster growth of conductive pathway(s). Without being limited by theory, it is believed that the conductive pathways grow due to oxidized metal atoms (e.g., metal cations, such as copper cations, silver cations) drifting from the ion-source material 112 through the discontinuous interfacial material 110 and the cell material 108 until reduced by the first electrode 106. The metal atoms drift through the cell material 108 and the discontinuous interfacial material 110 to bridge, i.e., electroconductively connect, the first electrode 106 and the second electrode 114.

Changes in the extent of the conductive pathways through the cell material 108 and the ion-source material 112 affect the resistance of the semiconductor device. The conductive pathway, e.g., the filament 124, remains intact when the voltage is removed. Reversing the polarity of the selectively-applied voltage can reverse the growth of the conductive pathway, such that the filament 124 electroconductively connecting the first electrode 106 and the second electrode 114 dissipates.

As shown in FIG. 2, in the memory cell 100 of the present disclosure, the formed conductive pathway extends through the interfacial material 110. The discontinuous nature of the interfacial material 110 provides for space between adherent atoms 111, which enables ions to drift through the interfacial material 110. The adherent atoms 111 of the interfacial material 110 may be evenly spaced in an ordered pattern. However, some adherent atoms 111 of the interfacial material 110 may be in close proximity to or in contact with other adherent atoms 111 while still being spaced from other adherent atoms 111 to allow for drift of atoms between at least some of the adherent atoms 111 of the interfacial material 110.

Accordingly, a memory cell is disclosed. The memory cell comprises a cell material and an ion-source material over the cell material. The ion-source material comprises atoms. The memory cell also comprises a discontinuous interfacial material between the cell material and the ion-source material.

Also disclosed is a method that comprises applying a voltage to a memory cell. The memory cell comprises a cell material over a first electrode, an ion-permeable material over the cell material, an ion-source material comprising atoms over the ion-permeable material, and a second electrode over the ion-source material. The ion-permeable material comprises interfacial complexes. Each interfacial complex comprises an adherent atom adsorbed to the cell material and bonded to at least one of the atoms of the ion-source material. The method further comprises drifting atoms through the ion-permeable material. By this method, a conductive pathway may be formed to electroconductively connect the first electrode and the second electrode.

Also disclosed is a method of forming an ion-source material over a first material. The method includes exposing the first material to an adhesion-promoter compound and chemisorbing the adhesion-promoter compound to the first material to form reactive sites. The method further includes forming the ion-source material over the reactive sites to form a discontinuous interfacial material between the first material and the ion-source material.

Forming the ion-source material over the reactive sites may include forming the ion-source material by ALD, CVD, or PVD. Therefore, in some embodiments, forming the ion-source material over the reactive sites includes exposing the reactive sites to a precursor of the ion-source material. In other embodiments, the ion-source material is formed by exposing the reactive sites to the ion-source material itself, rather than a precursor of the ion-source material.

Figure 3:
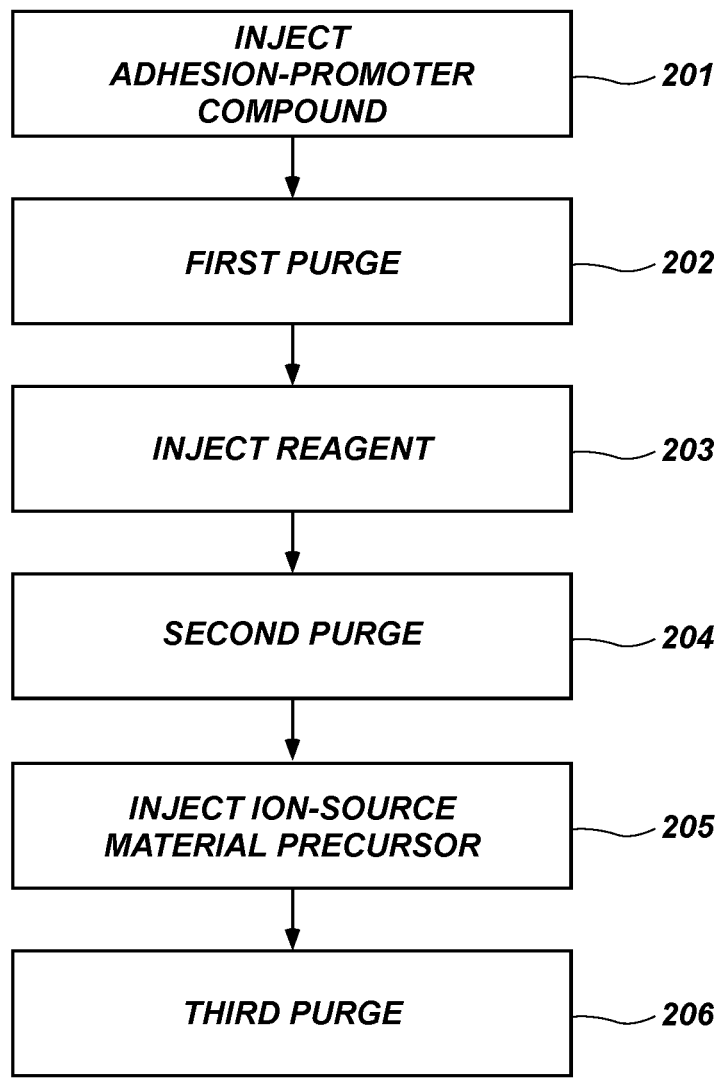
FIG. 3. is a flowchart of a method of the present disclosure for forming an ion-source material over a first material.

FIG. 3 is a flowchart of an embodiment of a method of forming an ion-source material over a first material. The method enables adhesion of the ion-source material to the first material by forming an interface therebetween. The first material may be a cell material (e.g., a cell dielectric), a substrate, or another substance supported by a substrate. The ion-source material precursor may be a material used to form an ion-source material 112, as shown in FIGS. 1 and 2.

According to the method charted in FIG. 3, the method includes exposing the first material to at least one adhesion-promoter compound. The adhesion-promoter compound includes at least one adherent atom and at least one ligand bonded to the adherent atom. In embodiments in which the method is carried out utilizing an atomic layer deposition (ALD) process, exposing the first material to the adhesion-promoter compound may be accomplished by injecting the adhesion-promoter compound into an ALD chamber housing a substrate supporting the first material (stage 201). The adhesion-promoter compound may be an ALD precursor compound that includes a metal and at least one ligand bonded to the metal, as known in the art. The metal of the adhesion-promoter compound may be the metal to be deposited as the interfacial material. The ligand may be a single atom, such as a halide group, multiple atoms, such as a hydrocarbon group or an alkoxide group, or combinations thereof. The halide group may be a fluoride, a chloride, a bromide, an iodide, or combinations thereof. The alkoxide group may be a methoxide group, an ethoxide group, a propoxide group, or combinations thereof. ALD precursor compounds are known in the art and, therefore, are not described in detail herein. The adhesion-promoter compound may be selected depending on the metal to be deposited as the interfacial material between the ion-source material and the first material. The injected adhesion-promoter compound may also be referred to herein as an ALD precursor compound. Exposing the first material to the adhesion-promoter compound results in adherent atoms of the adhesion-promoter compound chemisorbing to the first material.

In some embodiments, exposing the first material to the adhesion-promoter compound results in formation of a saturated, continuous monolayer of the adhesion-promoter compound chemisorbed to the surface of the first material. In such embodiments, the formed saturated, continuous monolayer may be such that all available adsorption sites on the surface of the first material are occupied by the adhesion-promoter compound. "Available" adsorption sites are those sites at which the adhesion-promoter compound may chemisorb to the surface of the first material. The number of "available" adsorption sites may be limited as chemisorption occurs in that already-chemisorbed molecules may effectively block, and therefore make unavailable, portions of the surface of the first material. In other embodiments, exposing the first material to the adhesion-promoter compound results in formation of a non-saturated, discontinuous monolayer of the adhesion-promoter compound chemisorbed to the surface of the first material. In such embodiments, the formed non-saturated, discontinuous monolayer may be such that not all available adsorption sites on the surface of the first material are occupied by the adhesion-promoter compound. The pressure and temperature of the ALD chamber, as well as the size and steric complexity of the ligands of the adhesion-promoter compound, may be selected so as to affect the desired coverage (e.g., saturated or non-saturated monolayer, continuous or discontinuous monolayer) of the chemisorbed adhesion-promoter compound on the first material.

A first purge (stage 202) may follow the injection of the adhesion-promoter compound (stage 201). The first purge (stage 202) may be configured to remove excess (e.g., non-chemisorbed) molecules of the adhesion-promoter compound from the ALD chamber. Optionally, an additional amount or amounts of the adhesion-promoter compound may be injected into the ALD chamber to achieve a desired coverage of the adhesion-promoter compound on the first material. Between each such subsequent injection of adhesion-promoter compound, non-chemisorbed molecules of the adhesion-promoter compound may be purged as previously described. Depending on the number of cycles of adhesion-promoter-compound injections, the amount and concentration of adhesion-promoter compound injected, the pressure and temperature of the ALD chamber, and other operation parameters, the method may form either a non-saturated monolayer including the adhesion-promoter compound adsorbed to the first material or a saturated monolayer including the adhesion-promoter compound adsorbed to the first material.

In embodiments in which formation of only a non-saturated monolayer of adhesion-promoter compound adsorbed to the first material is desired, injection of the adhesion-promoter compound (stage 201) may include injection of an amount of the adhesion-promoter compound that is insufficient to occupy all available reactive sites of the first material with adsorbed adherent atoms from the adhesion-promoter compound. The resulting non-saturated, partial monolayer of the adhesion-promoter compound may form the discontinuous interfacial material. The discontinuous interfacial material of such embodiments may therefore include not only the adherent atom chemisorbed to the first material, but also non-chemisorbed atoms or groups of atoms, ligands, bonded to the adsorbed adherent atoms. If desired, the ligands may be thereafter removed. In some embodiments, however, the ligands are not thereafter removed such that the ligands remain in the discontinuous interfacial material.

In embodiments in which a saturated monolayer including the adhesion-promoter compound adsorbed to the first material is formed, the ligands of the adhesion-promoter compound may be removed from the continuous monolayer to form the discontinuous interfacial material.

Whether a saturated or a non-saturated monolayer of adhesion-promoter compound is formed by stages 201 and 202, ligands may, optionally, be removed from the adsorbed adhesion-promoter compound. Thus, optionally, the method may continue by injecting a reagent (stage 203) into the ALD chamber to remove ligands. The reagent may be configured to dissociate the ligands from the adherent atoms of the adhesion-promoter compound. The reagent may include ammonia or another conventional reagent known to dissociate ligands, of the type present in the adhesion-promoter compound, from the adherent atoms. Dissociating the ligands from the adherent atoms leaves the adsorbed adherent atoms bonded to the first material. A second purge (stage 204) is conducted to remove the dissociated ligands from the ALD chamber. Additional cycles of reagent injections (stage 203) and second purges (204) may be carried out to accomplish the desired level of ligand removal to form the discontinuous interfacial material. The reagent injections (stage 203) and second purges (stage 204) may be formulated not to remove the chemisorbed adherent atoms from the first material to which they are bonded.

The method continues by exposing the chemisorbed adherent atoms to an ion-source material precursor. In an ALD embodiment, this is accomplished by injecting the precursor of the ion-source material into the ALD chamber (stage 205). The ion-source material precursor may be a compound appropriate for use in an ALD process. Such ALD precursors are known in the art and may be selected by a person of ordinary skill in the art. Exposing the chemisorbed adherent atoms to the ion-source material precursor results in the formation of interfacial complexes, each including at least one atom from the ion-source material bonded to at least one atom originally from the adhesion-promoter compound, e.g., the adherent atom. A third purge (stage 206) may follow the injection of the ion-source material precursor (stage 205) so as to remove unreacted ion-source material precursor from the ALD chamber.

Figure 4A:
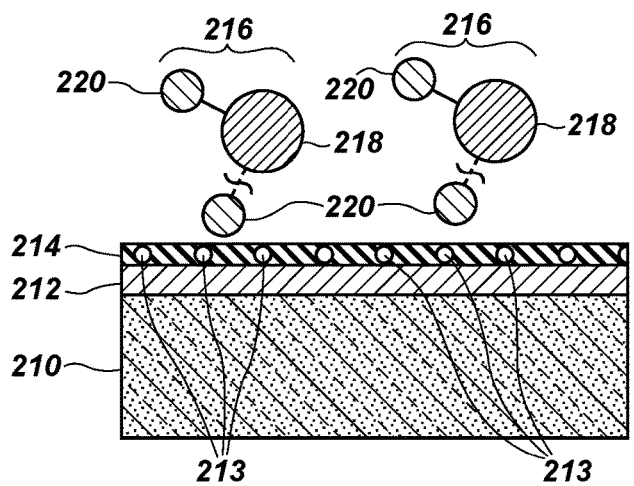
FIGS. 4A through 4G are cross-sectional, front elevation, schematic views of components of a memory cell during various stages of processing according to an embodiment of the present disclosure.

FIGS. 4A through 4G illustrate various stages in a method, such as the method of the embodiment charted in FIG. 3. As shown in FIG. 4A, a first material 214, which may be a cell material formed over a first electrode 212 of a conductive bridge RAM memory cell and supported by a substrate 210, includes a number of potential reaction surface sites 213.

The first material 214, with its reaction surface sites 213, is exposed to an adhesion-promoter compound 216. According to the illustrated embodiment, each adhesion-promoter compound 216 includes one adherent atom 218 and two ligands 220. However, in actuality, one, two, or more than two ligands 220 may be attached to the adherent atom 218, or more than one adherent atom 218 may be included in the molecule, or both. Multiple ligands 220 or adherent atoms 218 of the adhesion-promoter compound 216 may have the same or different chemical compositions. Exposing the first material 214 to the adhesion-promoter compound 216 may result in one or more bonds forming between the adherent atom 218 and the first material 214 at one of the reaction surface sites 213 such that the reaction surface site 213 is then an occupied reaction surface site 215.

Figure 4B:
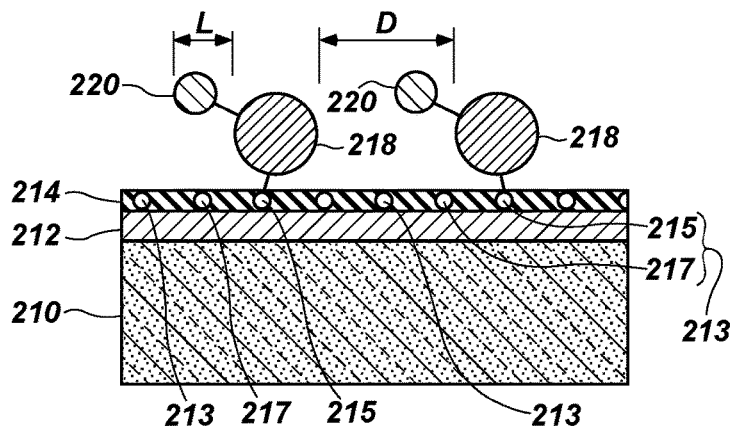

With reference to FIG. 4B, the adhesion-promoter compound 216 may chemisorb to the first material 214 to form chemisorbed adherent atoms bonded to now-occupied reactions surface sites 215, each including the adherent atom 218 and the ligand 220. The chemisorption may result in disassociation of some or all of the ligands 220 from the adherent atoms 218. Disassociation may occur to enable bonding between the adherent atoms 218 and the first material 214.

Depending on the amount and conditions of the injection of the adhesion-promoter compound 216 into the ALD chamber, the adherent atoms 218 may chemisorb near to or away from neighboring adherent atoms 218. It is expected that, due to the three-dimensional geometries (i.e., sterics) of the molecules of the adhesion-promoter compound 216, neighboring adherent atoms 218 will be spaced from one another by a distance D that is at least as great as a width L defined by the ligand 220. Notably, the width L is not necessarily the tip-to-end length of the ligand 220, but rather the distance at which the ligand 220 protrudes from the adherent atom 218 in a plane parallel with the surface of the first material 214.

The ligands 220 utilized in the adhesion-promoter compound 216 may be appropriately selected to achieve the desired packing density of the adherent atoms 218 in the resulting discontinuous interfacial material. In some embodiments, the ligand 220 may include multiple atoms, such as a hydrocarbon group, and the complexity and geometry (i.e., sterics) of the attached group may result in adherent atoms 218 being positioned further from one another than in embodiments utilizing ligands 220 of fewer atoms or a single atom. The sterics of the adhesion-promoter compound 216 may further result in some of the reaction surface sites 213 being effectively blocked to adsorption by an additional adherent atom 218. Hence, such blocked reaction surface sites 213 are unavailable reaction surface sites 217. Using larger ligands 220, ligands 220 with increased steric complexity, few adhesion-promoter-compound-injection cycles, a low amount of injected adhesion-promoter compound, a low concentration of injected adhesion-promoter compound, or any combination thereof, may provide for a low percentage coverage of the surface of the first material 214 with the adherent atoms 218. Alternatively, using smaller ligands 220, ligands 220 with little steric complexity, a high amount of injected adhesion-promoter compound, a high concentration of injected adhesion-promoter compound, or any combination thereof, may provide for a high percentage coverage (up to a maximum coverage of complete saturation) of the surface of the first material 214 with adherent atoms 218.

Figure 4C:
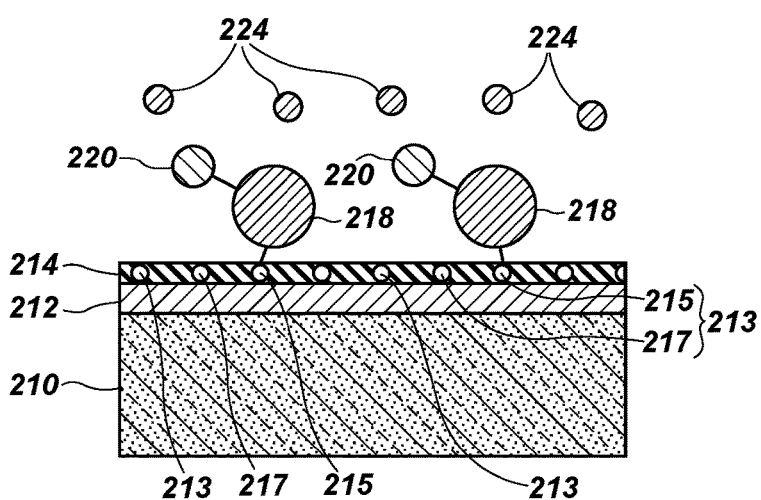
Figure 4D:
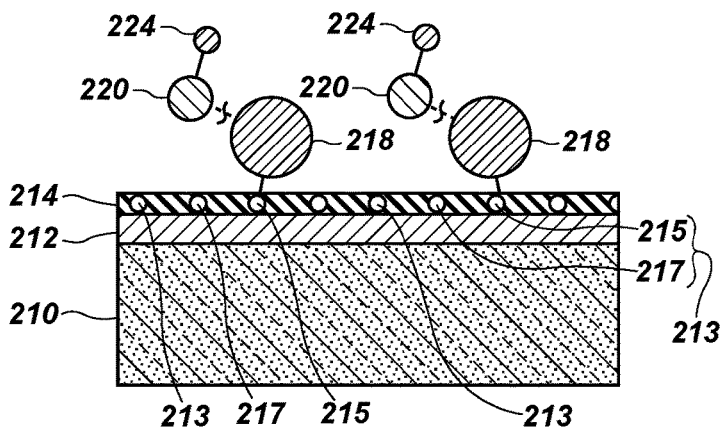
Figure 4E:
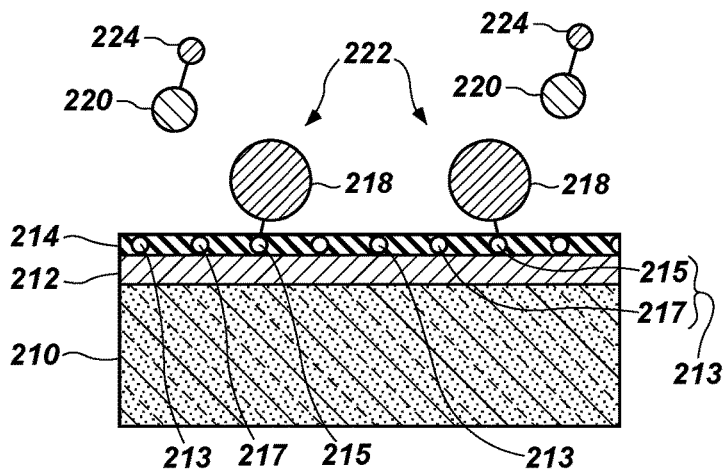

With reference to FIG. 4C, the chemisorbed adherent atoms 218 and ligands 220 may, optionally, be exposed to a reagent 224 to remove the ligands. Though the reagent 224 is depicted as a single atom material, the reagent may alternatively include multiple atoms, molecules, and/or materials. With reference to FIG. 4D, the reagent may react with the ligands 220 to disassociate or otherwise remove the ligands 220 from the adherent atoms 218. With reference to FIG. 4E, the ligand 220 and reagent 224 may thereafter be purged from the system to leave the adherent atoms 218 chemisorbed to the first material 214. These chemisorbed adherent atoms 218 may function as reactive sites 222. In other embodiments in which ligands 220 are not removed from the chemisorbed adherent atoms 218, the ligands 220 and adherent atoms 218 may function as the reactive sites 222.

Figure 4F:
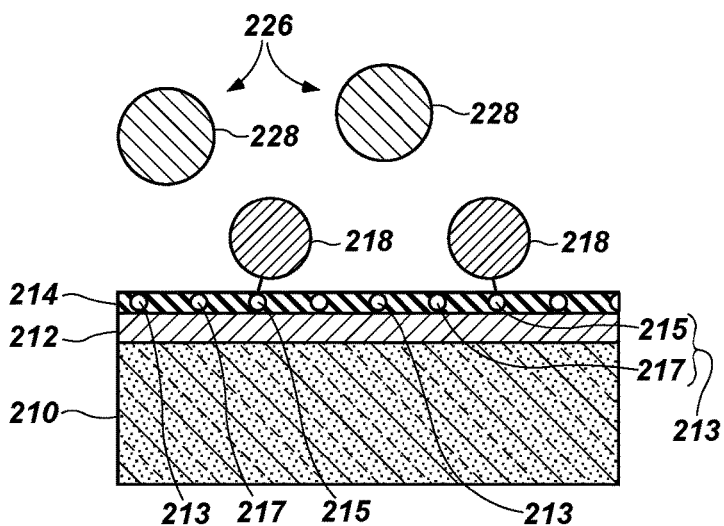

The ion-source material may then be formed over the reactive sites 222. With reference to FIG. 4F, the reactive sites 222 may be exposed to an ion-source material precursor 226 that includes ion-source atoms 228. For example, and without limitation, the ion-source atoms 228 may be metal atoms. In other embodiments, the ion-source material may be formed without use of an ion-source material precursor 226, such as by exposing the reactive sites 222 directly to the ion-source atoms 228.

Figure 4G:
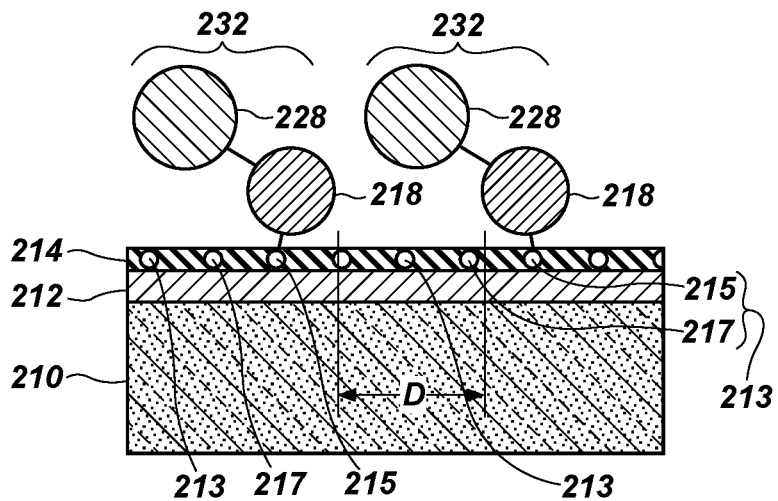

With reference to FIG. 4G, forming the ion-source material over the reactive sites 222 forms interfacial complexes 232 that include at least one adherent atom 218 and at least one ion-source atom 228. In forming the ion-source material, the adherent atoms 218 chemisorbed to the first material 214 may react with ion-source atoms 228 to form the interfacial complexes 232 including at least one adherent atom 218 bonded to at least one ion-source atom 228. The interfacial complexes 232 have at least one ion-source atom 228, which may be derived from the ion-source material precursor 226, and at least one adherent atom 218 chemisorbed to the first material 214. Notably, it is expected that the adherent atoms 218 within the interfacial complexes 232 will be in substantially the same position as the adherent atoms 218 were positioned when originally chemisorbed to the first material 214. Therefore, the adherent atoms 218 of the interfacial complexes 232 may be spaced from other adherent atoms 218 by a distance D greater than or equal to the width L that was defined by the ligand 220 of the adhesion-promoter compound.

Figure 4H:
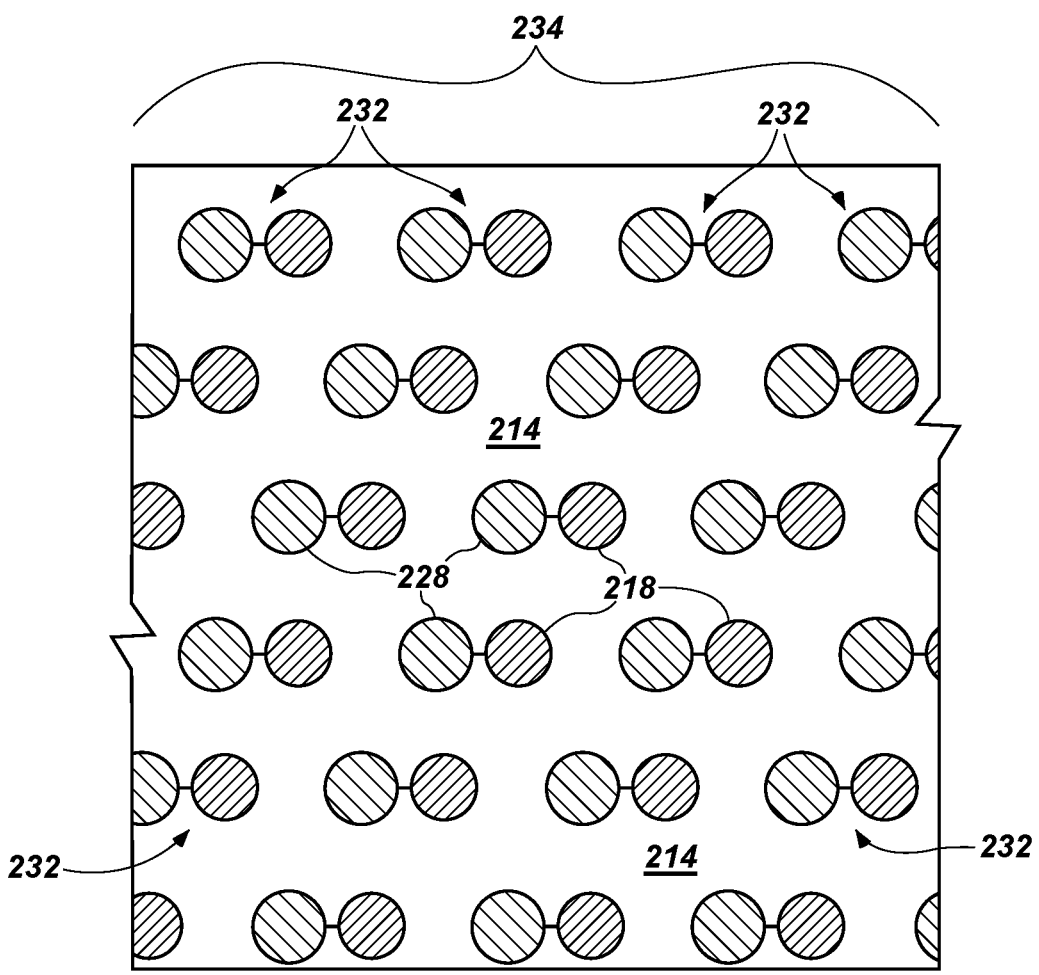
FIG. 4H is a top plan, schematic view of a discontinuous interfacial material of an embodiment of the present disclosure.

With reference to FIG. 4H, the plurality of interfacial complexes 232 form a discontinuous interfacial material 234 over the first material 214. This discontinuous interfacial material 234 is a partial monolayer of the adherent atoms 218. The adherent atoms 218, or another atom bonded directly or indirectly to the adherent atom 218, may be bonded to an atom derived from the ion-source material, e.g., ion-source atom 228. The resulting discontinuous interfacial material 234 is configured to enable drift of atoms (e.g., ions) between the adherent atoms 218 of the interfacial complexes 232 and through the discontinuous interfacial material 234. By enabling drift of the atoms, conductive filaments 124 (FIG. 2) may be formed through the discontinuous interfacial material 234.

Figure 5:
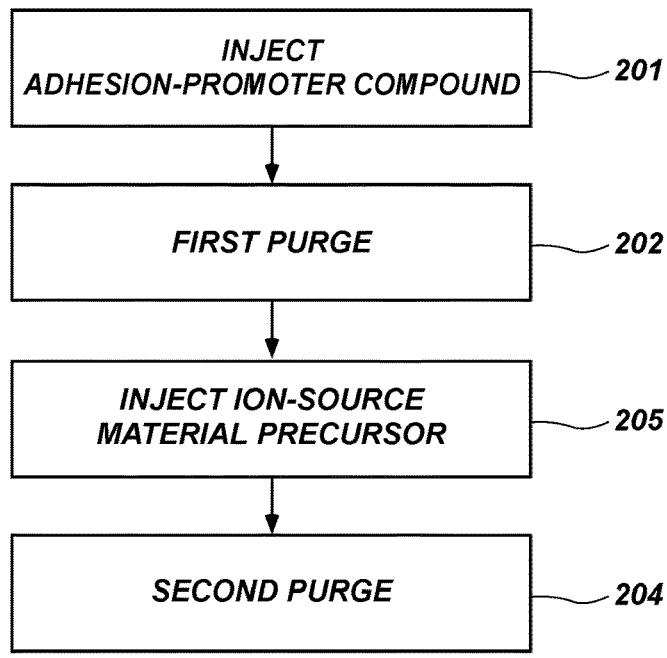
FIG. 5 is a flowchart of a method of the present disclosure for forming an ion-source material over a first material.

FIG. 5 charts a process flow for another embodiment of the present method of forming an ion-source material over a first material. The method enables adhesion of the ion-source material to the first material by forming an interface therebetween. As with the prior embodiment, the method includes, in an ALD embodiment, injecting an adhesion-promoter compound (e.g., an ALD precursor compound) (stage 201) into an ALD chamber and then conducting a first purge (stage 202) to remove excess (e.g., non-chemisorbed) compound. Again, additional cycles of adhesion-promoter-compound injections (stage 201) and first purges (stage 202) may follow to achieve the desired extent of surface coverage by the chemisorbed adhesion-promoter compound (up to a maximum of complete saturation). Unlike the prior embodiment, however, the method of this charted embodiment follows the injection of the adhesion-promoter compound (stage 201) and first purge (stage 202) with an injection of ion-source material precursor (stage 205). Therefore, when the ion-source material precursor (stage 205) is introduced, the ligands of the adhesion-promoter compound remain bonded to the adherent atoms. Injection of the ion-source material precursor (stage 205) is followed by a second purge (stage 204) to remove excess (e.g., un-reacted) ion-source material. Additional cycles of ion-source-material precursor injection (stage 205) and second purge (stage 204) may follow to achieve the desired coverage of ion-source material (up to a maximum of complete saturation). For example, the injections of the ion-source material precursor (stage 205) may be repeated to achieve a saturated film of the ion-source material.

Figure 6A:
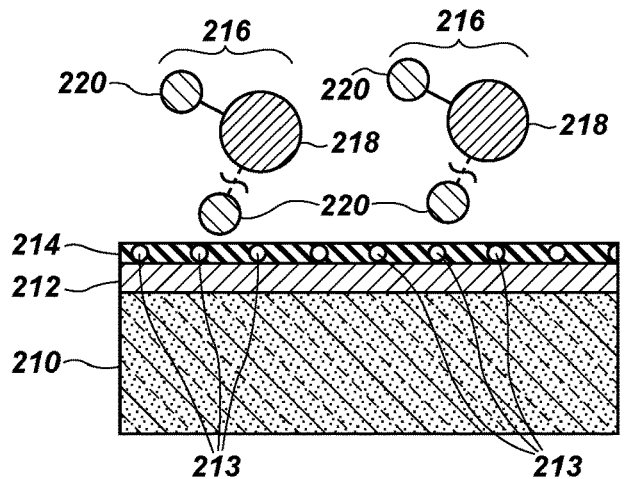
FIGS. 6A through 6F are cross-sectional, front elevation, schematic views of components of a memory cell during various stages of processing according to an embodiment of the present disclosure.
Figure 6B:
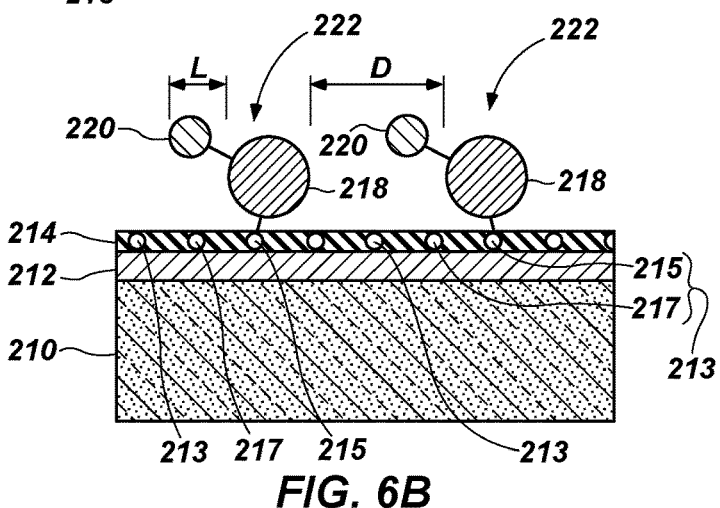

FIGS. 6A through 6F illustrate various stages in a method, such as the method of the embodiment charted in FIG. 5. As shown in FIGS. 6A and 6B, exposing the first material 214, and the reaction surface sites 213 of the first material 214, to the adhesion-promoter compound 216 results in chemisorption of the adherent atoms 218 to the first material 214 thereby creating bonds between the adherent atoms 218 and the first material 214 at occupied reaction surface sites 215. In chemisorbing to the first material 214, one or more of the ligands 220 of the adhesion-promoter compound 216 may be disassociated from the adherent atom 218, as shown in FIG. 6A. Certain of the reaction surface sites 213 may thereafter be effectively unavailable reaction surface sites 217 due, for example, to the sterics of the chemisorbed molecules. As these chemisorbed molecules are to be reacted with the ion-source material to be introduced, the chemisorbed molecules are the reactive sites 222.

Figure 6C:
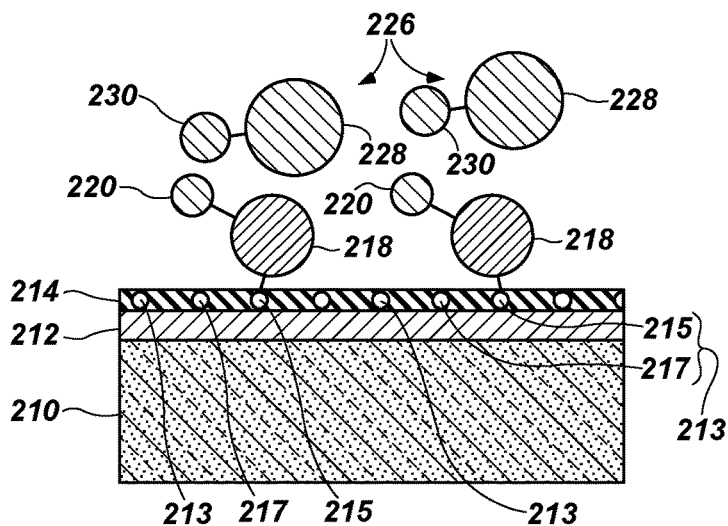

With reference to FIG. 6C, the reactive sites 222 (FIG. 6B) may be exposed to an ion-source material precursor 226 that includes ion-source atoms 228 bonded to another ligand 230. In other embodiments, the ion-source material is formed over the reactive sites 222 without use of an ion-source material precursor 226. Rather, the ion-source material may be directly formed over the reactive sites 222.

Figure 6D:
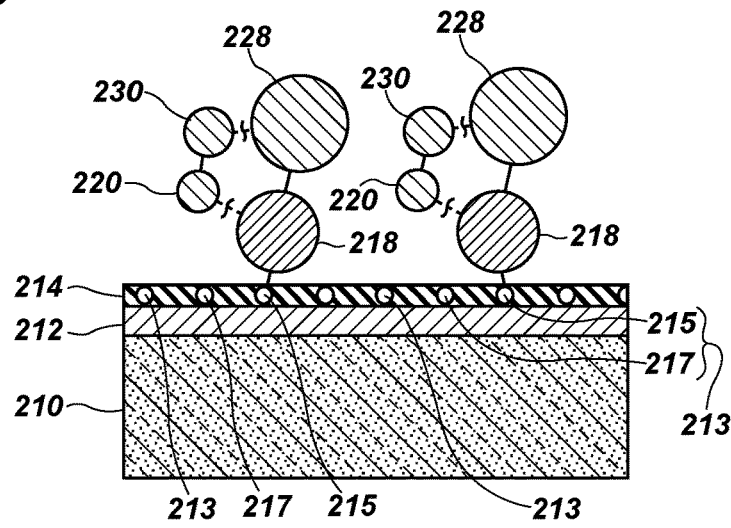
Figure 6E:
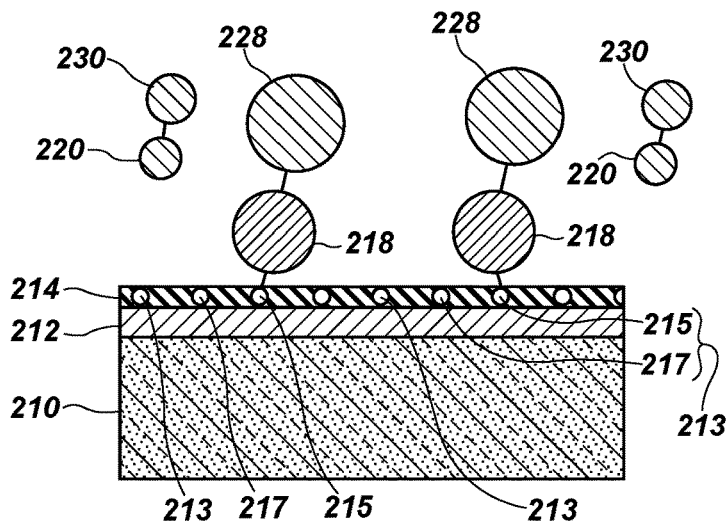
Figure 6F:
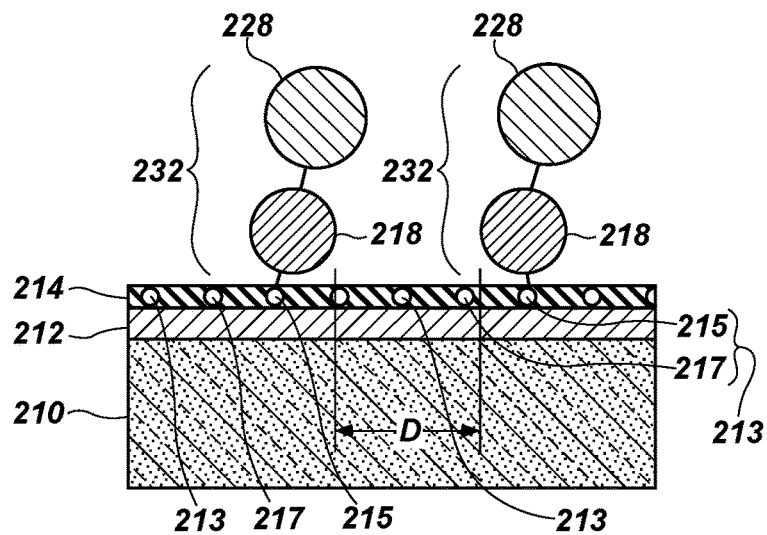

The adhesion-promoter compound 216 may, for example, include a metal adherent atom bound to an alkoxy group ligand, and the ion-source material may, for example, include a copper ion-source atom bound to a silicon ligand. With reference to FIG. 6D, the ligand 220 bound to the adherent atom 218 may react with the ligand 230 bound to the ion-source atom 228 while the adherent atom 218 reacts with the ion-source atom 228. Therefore, a bond is formed between the ligands 220, 230 and another bond is formed between the adherent atom 218 and the ion-source atom 228 while the ligands 220, 230 dissociate from the adherent atom 218 and the ion-source atoms 228, respectively. Thus, the reaction of the ion-source material precursor 226 with the chemisorbed adhesion-promoter compound 216 of the reactive sites 222 is a displacement reaction. With reference to FIG. 6E, the result enables the ligands 220, 230 to be purged from the system. With reference to FIG. 6F, the interfacial complexes 232 remain with the adherent atoms 218 again separated from one another by a distance D, which is greater than or equal to the width L (FIG. 6B) defined by the ligand 220 of the adhesion-promoter compound 216.

Figure 6G:
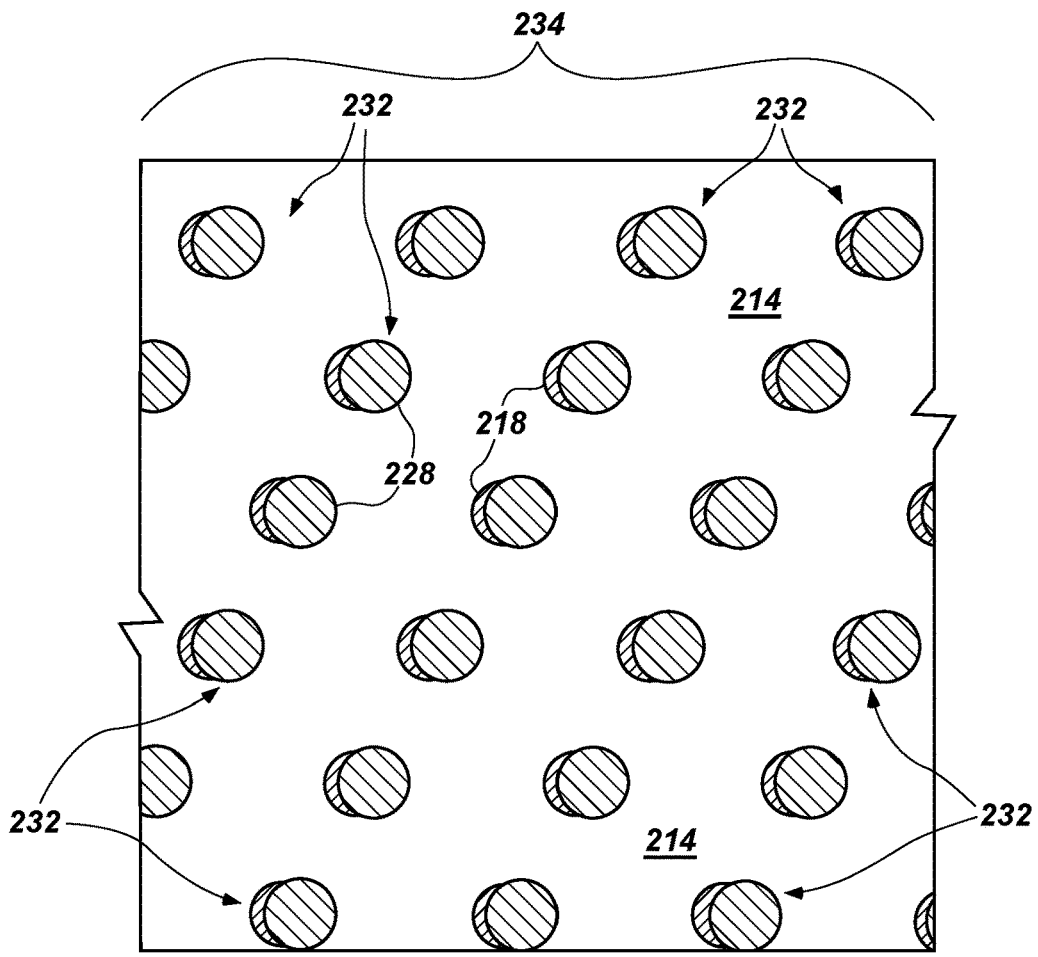
FIG. 6G is a top plan, schematic view of a discontinuous interfacial material of an embodiment of the present disclosure.

With reference to FIG. 6G, again, the plurality of interfacial complexes 232 forms a discontinuous interfacial material 234. A comparison of FIG. 6G with FIG. 4H illustrates that steric hindrances of the ligands and different compound geometries involved in the process result in interfacial complexes 232 of different geometries. Accordingly, the embodiment of the method illustrated in FIG. 6G of forming an ion-source material over a first material produces a discontinuous interfacial material 234 between the first material 214 and the formed ion-source material with interfacial complexes 232 having a more vertical alignment of the adherent atom 218 and bonded ion-source atom 228 than the interfacial complexes 232 of the first illustrated embodiment (FIG. 4H).

Figure 7A:
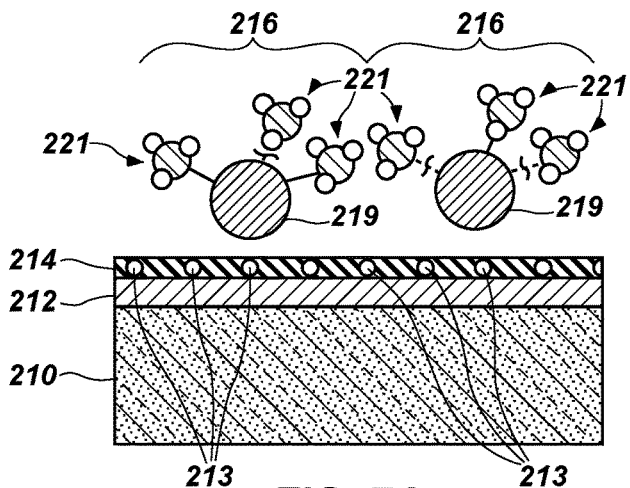
FIGS. 7A through 7E are cross-sectional, front elevation, schematic views of components of a memory cell during various stages of processing according to an embodiment of the present disclosure.
Figure 7B:
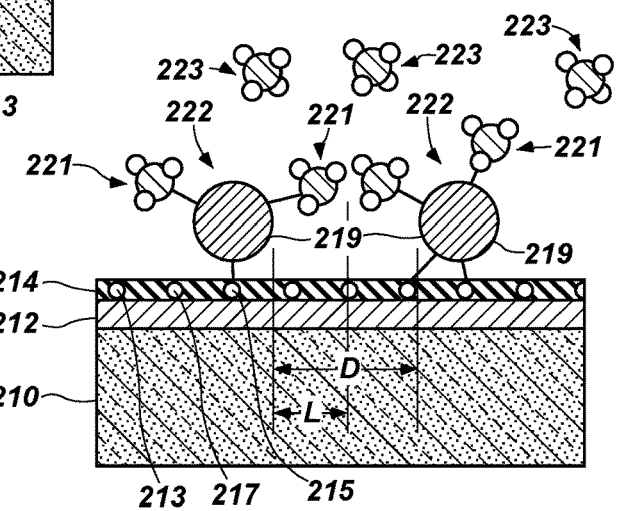

FIGS. 7A through 7E illustrate various stages in another embodiment, such as the embodiment charted in FIG. 5. With reference to FIG. 7A, according to this embodiment, the first material 214, including the reaction surface sites 213 therein, is exposed to an adhesion-promoter compound 216 having an aluminum atom 219 as the adherent atom and three hydrocarbon chains, specifically methyl groups, bonded thereto as methyl group ligands 221, e.g., trimethyl aluminum (TMA). With reference to FIG. 7B, the chemisorption of the aluminum atoms 219 to the first material 214 results in one or more bonds between the aluminum atom 219 and the first material 214 at reaction surface sites 213. These bonds occupy certain reaction surface sites 213, i.e., occupied reaction surface sites 215. In forming these bonds, one or more of the methyl group ligands 221 may be displaced from the aluminum atom 219 and may form methane 223 molecules, which can then be purged. Thus, the aluminum atoms 219 chemisorbed to the first material 214 form the reactive sites 222 in which the aluminum atoms 219 are spaced from one another by a distance no less than a width L defined by the methyl group ligands 221. Given the sterics of the trimethyl aluminum adhesion-promoter compound 216, in this embodiment, it is expected that the minimum distance D separating the aluminum atoms 219 from one another will be greater than the width L defined by the size of methyl group ligand 221. For example, the minimum distance D may be about equal to or greater than twice the width L defined by the methyl group ligand 221. Sterics of the reactive sites 222 may make unavailable certain of the reaction surface sites 213, i.e., the unavailable reaction surface sites 217. For example, unavailable reaction surface site 217, as shown in FIG. 7B may not be available for bonding with another aluminum atom 219 because the unavailable reaction surface site 217 may be effectively blocked by the overlying methyl group ligand 221.

Figure 7C:
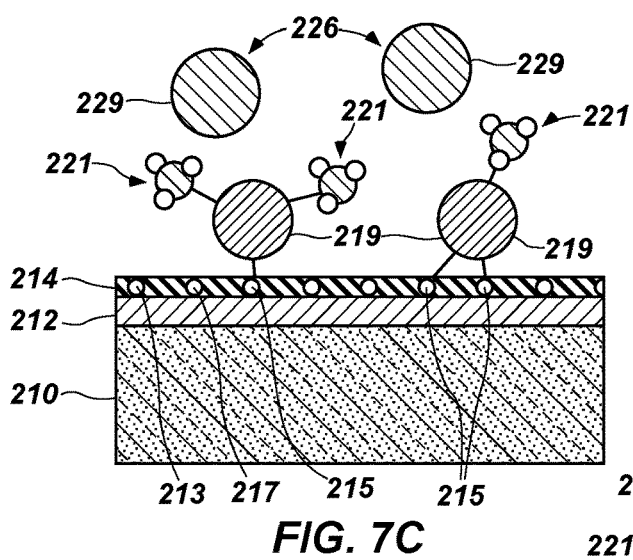
Figure 7D:
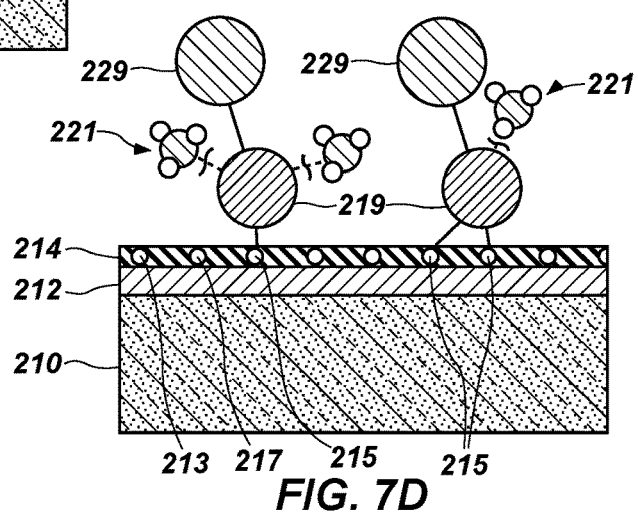
Figure 7E:
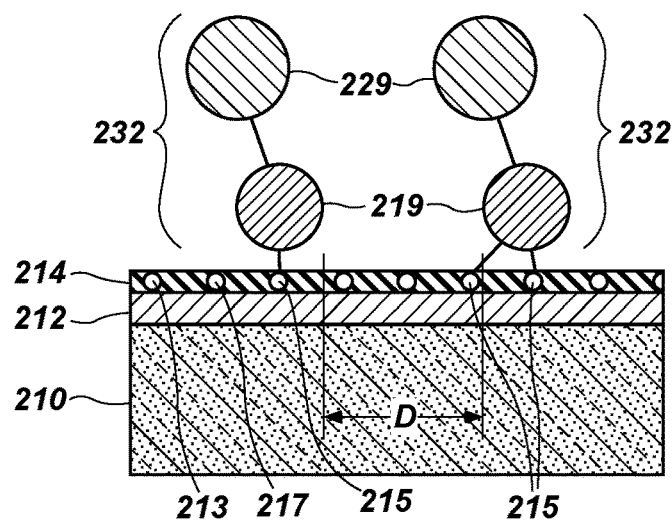
Figure 7F:
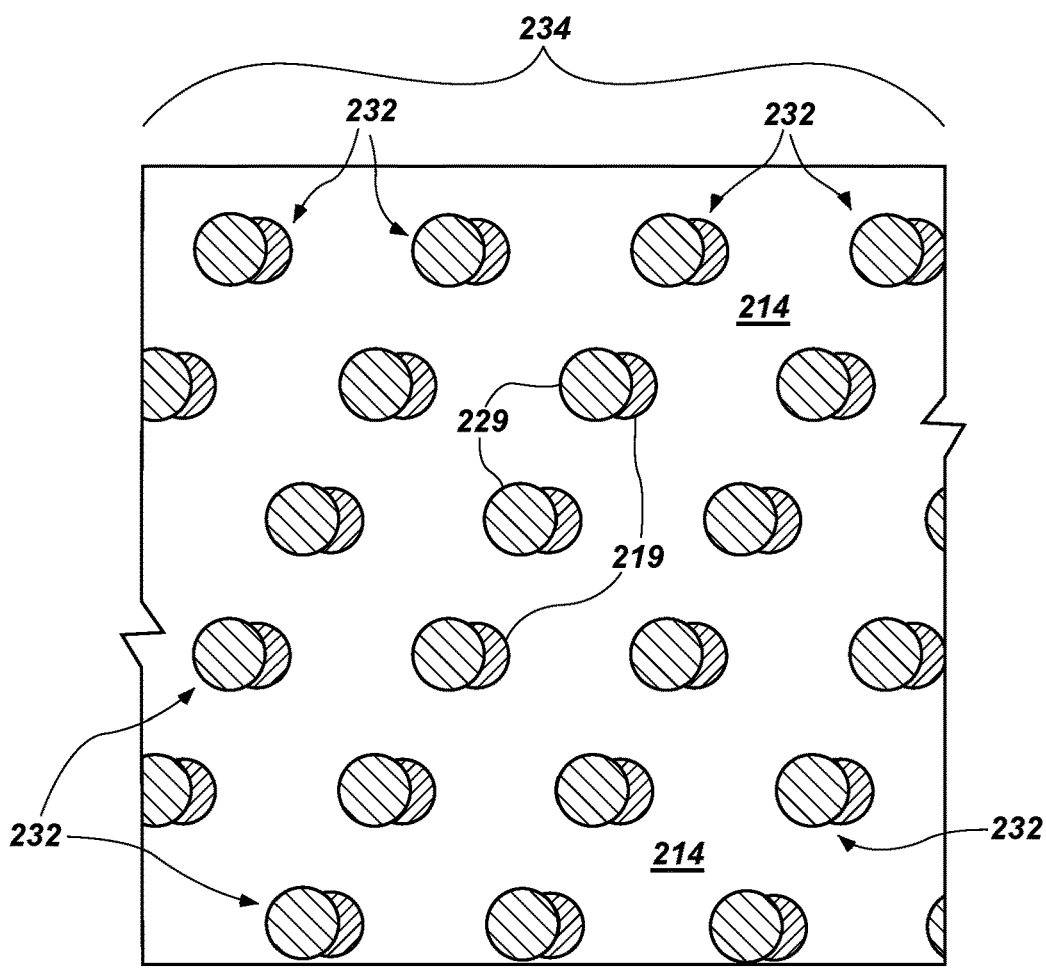
FIG. 7F is a top plan, schematic view of a discontinuous interfacial material of an embodiment of the present disclosure.

With reference to FIG. 7C, the reactive sites 222 (FIG. 7B) are exposed to an ion-source material precursor 226, which, in this embodiment, includes copper atoms 229. With reference to FIG. 7D, the copper atoms 229 react with the trimethyl aluminum adhesion-promoter compound 216 (FIG. 7A). The resulting copper-aluminum bond is stronger than the aluminum-methyl bonds. Therefore, the remaining methyl groups disassociate from the aluminum atoms 219. With reference to FIG. 7E, this results in the interfacial complexes 232 including the chemisorbed aluminum atoms 219 (e.g., aluminum atoms 219 chemisorbed to the first material 214) and bonded copper atoms 229 (e.g., copper atoms 229 bonded to the aluminum atoms 219). Again, the aluminum atoms 219 are spaced from another aluminum atom 219 by a distance D that is equal to or greater than the width L defined by the methyl group ligands 221. With reference to FIG. 7F, a discontinuous interfacial material 234 results.

Accordingly, disclosed is a method that comprises exposing a first material to an adhesion-promoter compound. The adhesion-promoter compound comprises an adherent atom and at least one ligand bonded to the adherent atom. The adhesion-promoter compounds are chemisorbed to the first material to form reactive sites. Each reactive site comprises at least one of the adherent atoms. The adherent atom of one reactive site is spaced from the adherent atom of another reactive site by a distance equal to or greater than a width of the at least one ligand. An ion-source material is formed over the reactive sites to form a discontinuous interfacial material between the first material and the ion-source material.

By utilizing the methods of the present disclosure, many acts for fabricating the memory cell 100 may be conducted in a single tool, such as in an ALD chamber. Since many of the fabrication acts are ALD processes or ALD-like processes, the process may be conducted in a single tool, such as in an ALD chamber. The fabrication acts may be conducted without breaking a vacuum (e.g., reduced pressure environment) in the ALD chamber. Since adhesion of the cell material 108 and the ion-source material 112 may be increased by the presence of the interfacial material 110, which may be formed in an ALD chamber, the ALD chamber may be used to deposit the cell material 108, the ion-source material 112, and the interfacial material 110 in situ.

Figure 8:
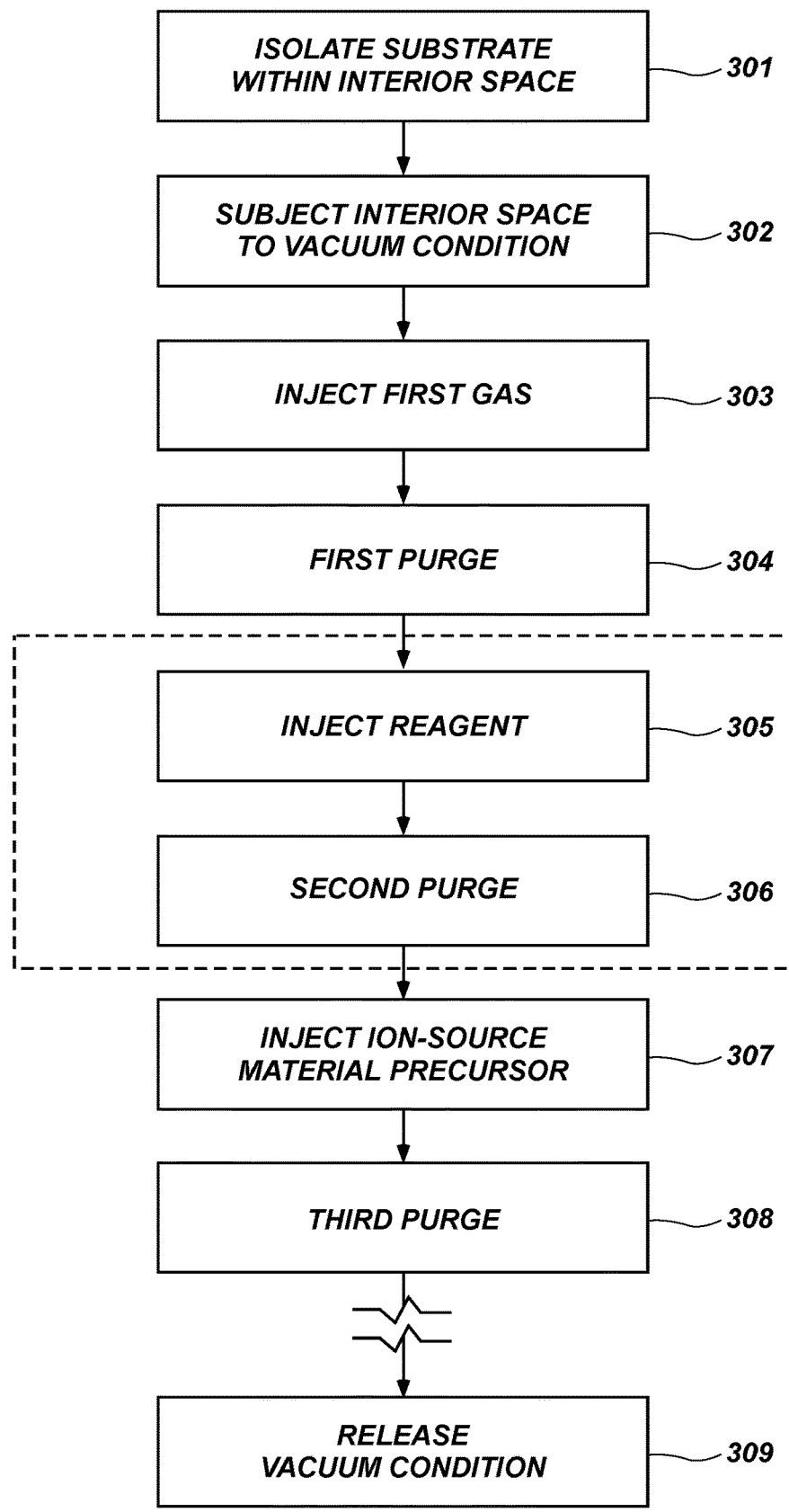
FIG. 8 is a flowchart of a method of the present disclosure for utilizing an atomic layer deposition system.

Also disclosed is a method of utilizing an ALD chamber to conduct some or all of the fabrication acts. FIG. 8 charts an embodiment of the method that includes isolating a substrate within an interior space of the ALD chamber (stage 301). Herein "isolating" the substrate refers to segregating the substrate from materials exterior to the ALD chamber. "Isolating a substrate within an interior space" does not necessarily require the absence of other materials from the interior space. The method further includes subjecting the interior space to a vacuum condition (stage 302). Accordingly, gas from within the ALD chamber may be evacuated to lower the pressure of the interior space relative to the pressure exterior to the ALD chamber. The vacuum condition may be imposed so as to establish that the interior space of the ALD chamber is free of reactive species that could damage the substrate or components thereon.

The method of utilizing an ALD chamber may further include introducing a first gas into the interior space of the ALD chamber. Introducing the first gas may be accomplished by injecting the first gas into the interior space (stage 303). The first gas may be a conventional ALD precursor that includes adherent atoms, each bonded to at least one ligand. Injecting the first gas into the interior space (stage 303) results in the formation of a saturated or non-saturated film of the ALD precursor over the substrate. The formed saturated or non-saturated film may be formed directly on a cell material supported by the substrate. The injection of the first gas (stage 303) may be followed by a first purge (stage 304). Additional cycles of first gas injections (stage 303) and first purges (stage 304) may be performed to achieve the film of the desired surface area percent coverage.

Some embodiments of the charted method may include, optionally, injecting a reagent (stage 305) into the interior space to displace the ligands from the chemisorbed adhesion-promoter compound. The dissociated ligands may then be removed from the interior space by a second purge (stage 306). Cycles of the reagent injections (stage 305) and second purge (stage 306) may be repeated to achieve the desired amount of ligand removal.

Whether the ligands are removed due to the injection of the reagent (stage 305) or left on the adherent atoms, the formed discontinuous film comprises adherent atoms. The method continues with the introduction of an ion-source material precursor into the interior space of the ALD chamber. This may be accomplished by injecting the ion-source material precursor (stage 307) into the interior space, which may be followed by a third purge (stage 308). The ion-source material precursor includes a plurality of metal ion-source atoms. The ion-source material precursor injections (stage 307) and third purge (stage 308) may be repeated as needed to achieve the desired saturation of the resulting saturated film of metal ion-source atoms over the previously-formed discontinuous film of adherent atoms. Notably, if the discontinuous film included ligands on the adherent atoms at the time the ion-source material precursor is injected into the interior space, the ion-source material precursor may be formulated to react with the chemisorbed adhesion-promoter compound to displace the ligands from the adherent atoms. In other embodiments, the ion-source material precursor may be configured to react with the chemisorbed adherent atoms or ligands bonded to the chemisorbed adherent atoms without displacing the ligands from the adherent atoms. In still other embodiments, the ion-source material precursor may be configured to react with the chemisorbed adherent atoms to displace some but not all ligands from the adherent atoms. The resulting formed saturated film nonetheless includes ion-source atoms, derived from the ion-source material precursor, bonded to the adherent atoms of the discontinuous film. The discontinuous film of adherent atoms therefore is configured to accommodate drift of atoms (e.g., ions, cations), through the discontinuous film and between neighboring spaced adherent atoms.

The formation of the discontinuous film of adherent atoms and saturated film of metal ion-source atoms may be accomplished while the interior space of the ALD chamber is subjected to the vacuum condition. Therefore, it may not be necessary to break vacuum between stages 303 and 307.

The method of utilizing an ALD chamber may further include introducing a cell material into the interior space of the chamber. This may precede the distribution of the first gas, while the interior space of the ALD chamber is subjected to the vacuum condition. Therefore, the ALD chamber may be utilized to deposit the cell material over a substrate, to form a non-saturated film of adherent atoms, to form a saturated film of metal ion-source atoms all before releasing the vacuum condition (stage 309). In some embodiments, other materials may be formed within the ALD chamber before releasing the vacuum condition (stage 309). For example, in some embodiments, a cap material of a top electrode contact cap may be formed over the ion-source material before releasing the vacuum condition (stage 309).

Figure 9:
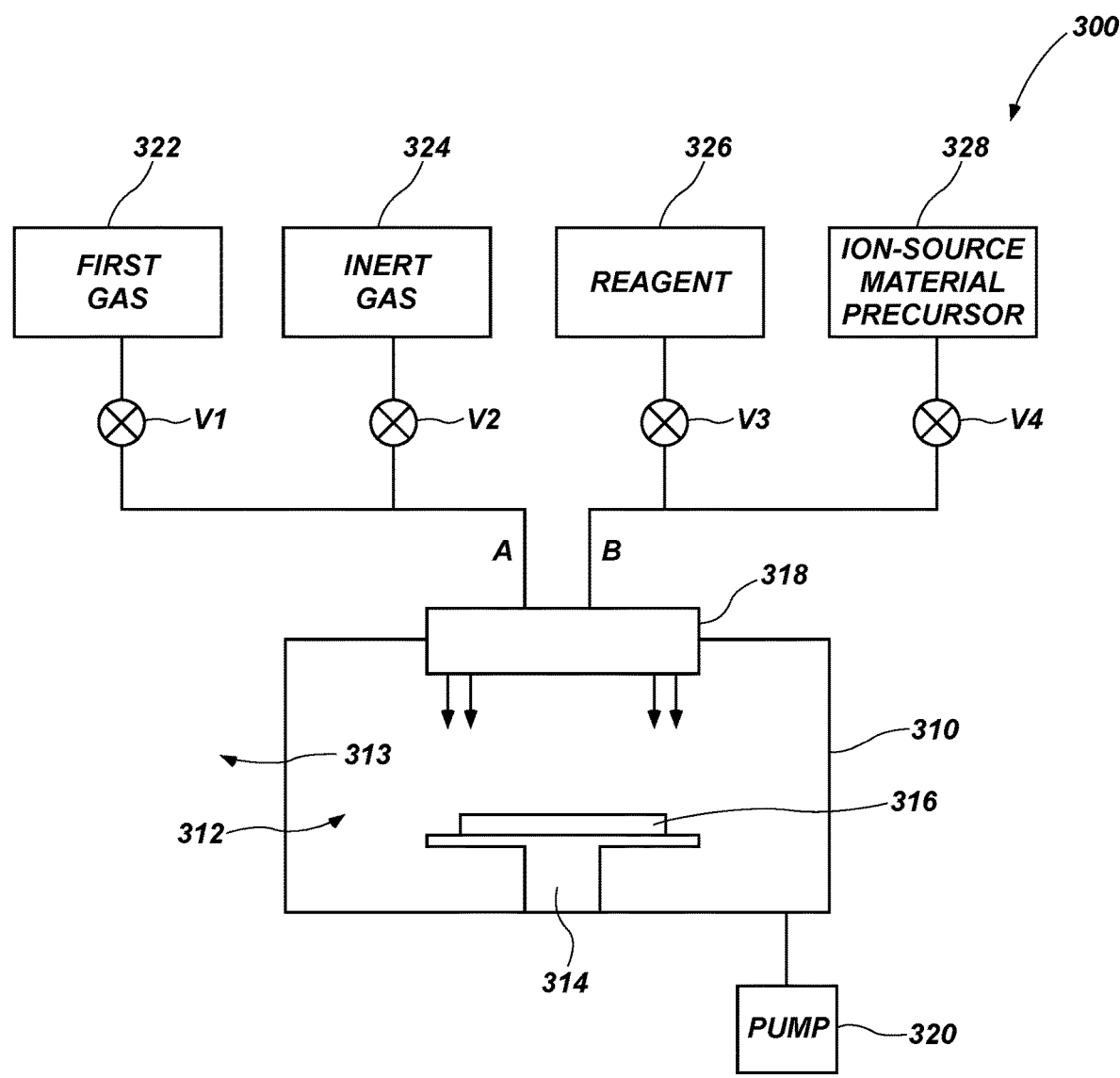
FIG. 9 is an elevation, schematic view of an atomic layer deposition system of an embodiment of the present disclosure.

FIG. 9 illustrates an ALD system 300. The ALD system 300 includes an ALD chamber 310, which provides a tool enclosure. The enclosure defines an interior space 312 isolatable from an exterior space 313. The ALD system 300 includes, within the interior space 312, a substrate supporter 314 upon which a substrate 316 may be supported during operation. The ALD system 300 further includes a shower head 318 operatively connected to various material sources, the injection of which is controlled via valves. According to the depicted embodiment, the shower head 318 is operatively connected with two gas inlets A and B. These inlets A, B are operatively connected to material sources for a first gas 322 via a first valve V1, an inert gas 324 via a second valve V2, a reagent 326 via a third valve V3, and an ion-source material 328 via a fourth valve V4. The inert gas 324 may be configured to accomplish purges of the interior space 312. The ALD system 300 may further include a pump 320 configured to be utilized to subject the interior space 312 to a vacuum condition.

Figure 10:
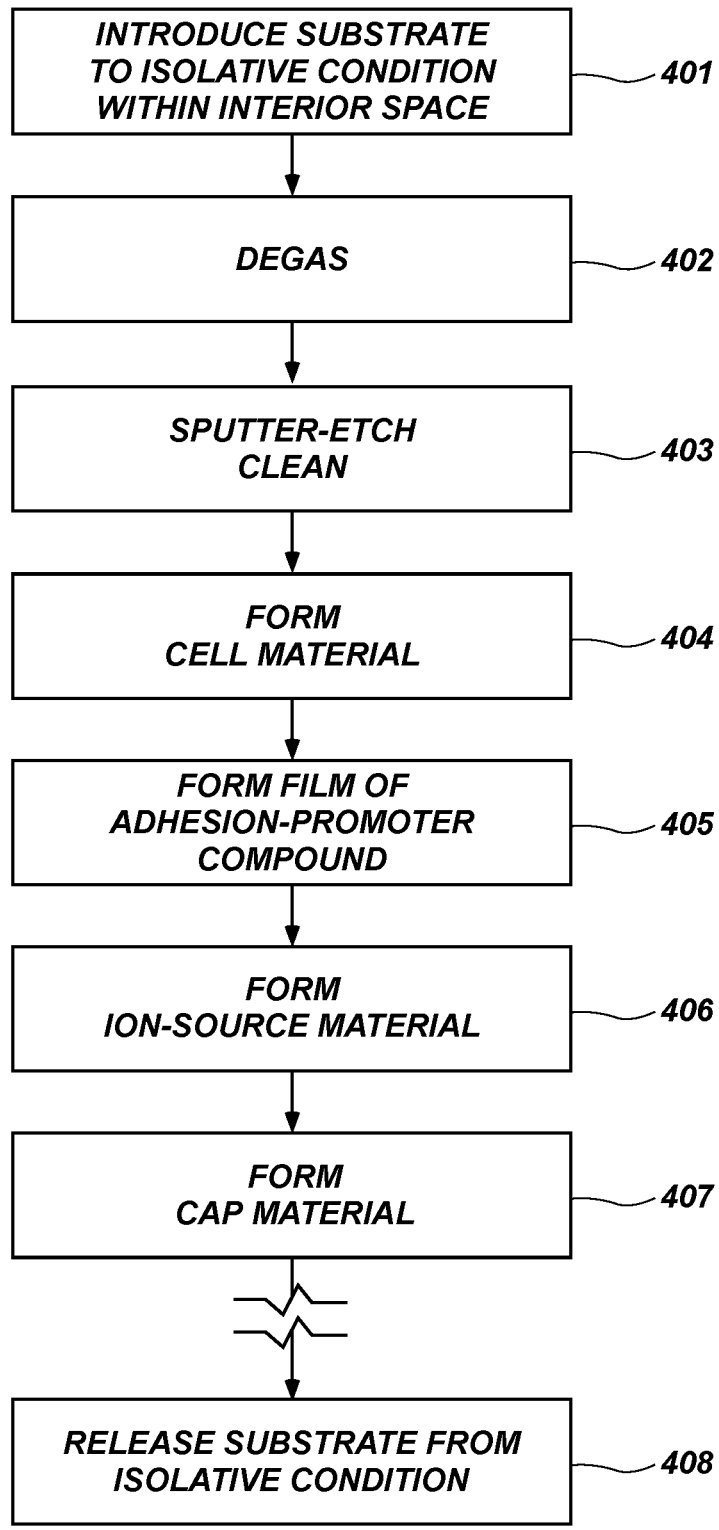
FIG. 10 is a flowchart of stages in a method of the present disclosure for forming a memory cell.

Also disclosed is a method of forming a memory cell. FIG. 10 charts an embodiment of such a method. According to the charted embodiment, the method begins by introducing a substrate to an isolative condition within an interior space of a tool enclosure (stage 401). This is followed by the formation of a plurality of materials over the substrate where the formation of materials is accomplished without removing the substrate from the isolative condition. Forming the plurality of materials may include any of a degassing process (stage 402), a sputter-etch clean process (stage 403), a formation of a cell material (stage 404), a formation of a film of adhesion-promoter compound (stage 405), a formation of an ion-source material (stage 406), and a formation of a cap material over the ion-source material (stage 407) such as material of a top electric contact. Forming the non-saturated film of adhesion-promoter compound (stage 405) may be accomplished using ALD to form a saturated or non-saturated interfacial monolayer of adhesion-promoter compound over the substrate. Forming the ion-source material (stage 406) may include forming a saturated film of ion-source material by ALD to form the ion-source material over the film of adhesion-promoter compound. Alternatively, forming the ion-source material (stage 406) may include forming the ion-source material by CVD or PVD. Forming the cap material over the ion-source material (stage 407) may be accomplished by in situ deposition of the cap material to form an electrically conductive cap configured to prevent oxidation of the underlying ion-source material once the substrate, with materials formed thereon, has been released from the isolative condition. Such a formed top cap may further provide a top electrode contact.

After the plurality of materials are formed within the tool enclosure, the substrate, now supporting formed materials, may be removed from the tool enclosure to release the substrate from the isolative condition (stage 408). In some embodiments, subjecting the substrate to the isolative condition within the interior space of the tool enclosure may further include lowering the pressure within the interior space of the tool enclosure relative to an exterior space defined by the tool enclosure so as to establish the isolative condition as a vacuum condition within the tool enclosure.

Figure 11:
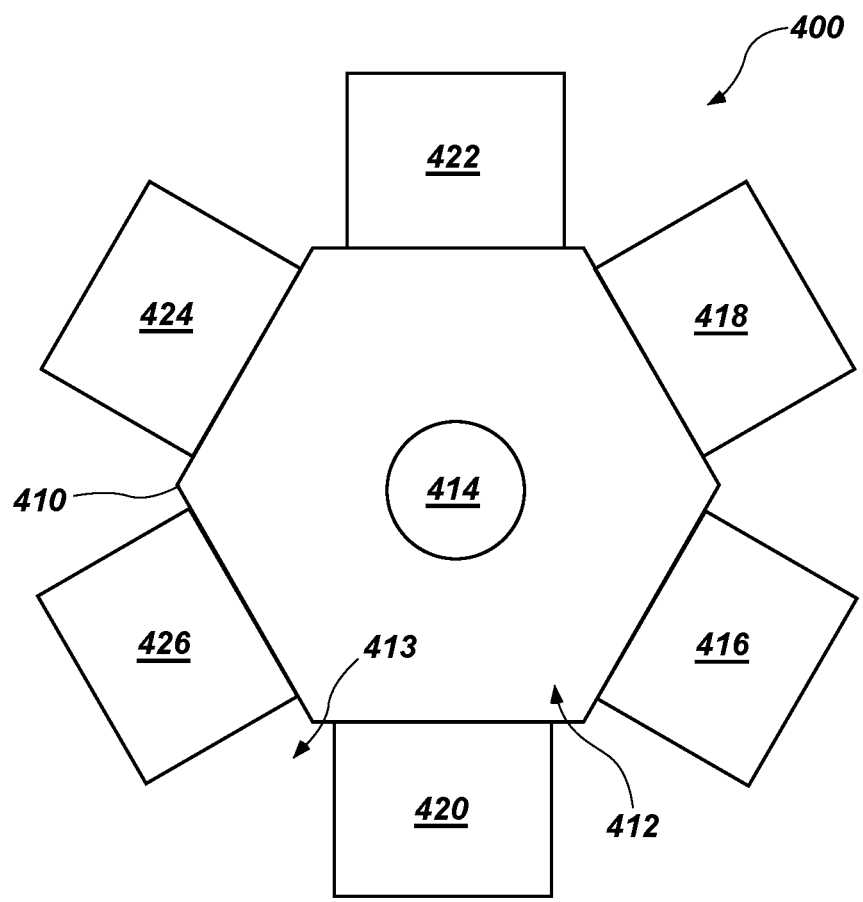
FIG. 11 is a top plan, schematic view of a semiconductor fabrication system of an embodiment of the present disclosure.

FIG. 11 illustrates a semiconductor fabrication system 400. The system 400 includes a tool enclosure 410 that defines an interior space 412 isolatable from an exterior space 413. The fabrication system 400 includes a plurality of chambers 416, 418, 420, 422, 424, 426 within the tool enclosure 410. A substrate 414 is supportable within the interior space 412 of the tool enclosure 410. A plurality of processes may be accomplished in the semiconductor fabrication system 400 via utilization of the chambers 416, 418, 420, 422, 424, 426 without removing the substrate 414 from the isolative condition within the tool enclosure 410. For example, the method charted in FIG. 10 may be accomplished by performing the degassing process (stage 402) within a degas chamber 416, by performing the sputter etch clean (stage 403) within a sputter etch clean chamber 418, by forming the cell material (stage 404) within a cell material chamber 420, by forming the film of adhesion promoter compound (stage 405) within an adhesion-promoter chamber 422, by forming the ion-source material (stage 406) within an ion-source material chamber 424, and by forming the cap material (stage 407) within a cap material formation chamber 426. In other embodiments, multiple processes may be carried out within one chamber or additional processes and attached chambers may be utilized without removing the substrate 414 from the isolative condition within the tool enclosure 410.

Accordingly, disclosed is a method that comprises introducing a substrate to an isolative condition within an interior space of a tool enclosure. The method further comprises forming materials over the substrate without removing the substrate from the isolative condition. Forming the materials over the substrate comprises forming by atomic layer deposition a non-saturated interfacial partial monolayer of adhesion-promoter compound over the substrate. Forming the materials over the substrate further comprises forming an ion-source material over the non-saturated interfacial partial monolayer.

Figure 12:
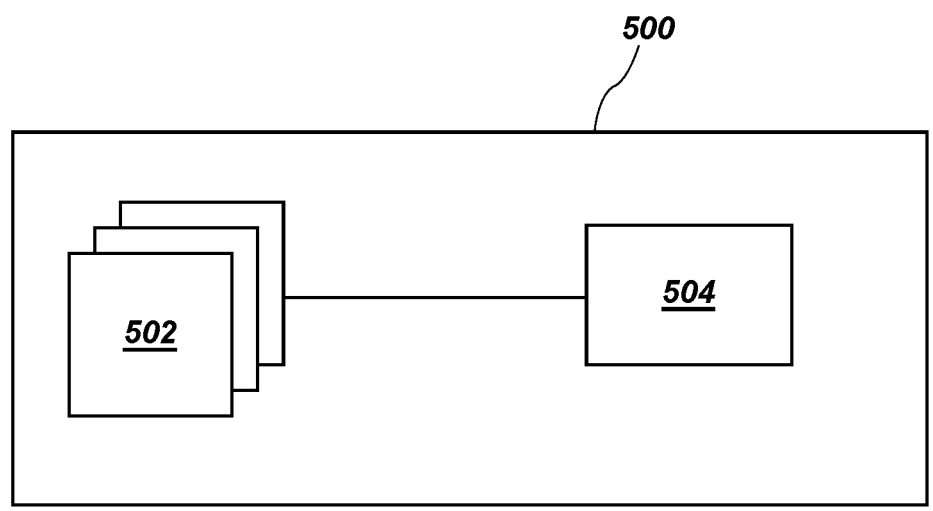
FIG. 12 is a simplified block diagram of a semiconductor device including memory cells of an embodiment of the present disclosure.

Also disclosed is a semiconductor device. FIG. 12 illustrates a simplified block diagram of a semiconductor device 500 implemented according to one or more embodiments described herein. The semiconductor device 500 includes at least one memory cell, such as a memory array 502 including a plurality of memory cells 100 (FIG. 1), and a control logic component 504. The memory cells within the memory array 502 may be conductive bridge RAM cells, resistive random-access memory (RRAM) cells, or other conductive-bridge-growing memory cells. The memory cells and components therein may be formed according to one or more of the embodiments described herein. The control logic component 504 may be configured to operatively interact with the memory array 502 so as to apply a voltage, remove a voltage, read, or write any or all memory cells (e.g., memory cells 100) within the memory array 502.

Accordingly, disclosed is a semiconductor device comprising memory cells. Each memory cell comprises a cell material and an ion-source material over the cell material. The ion-source material comprises atoms. The memory cell also comprises an ion-permeable material between the cell material and the ion-source material. The ion-permeable material comprises adherent atoms each chemisorbed to the cell material and bonded to at least one atom within the ion-source material.

Figure 13:
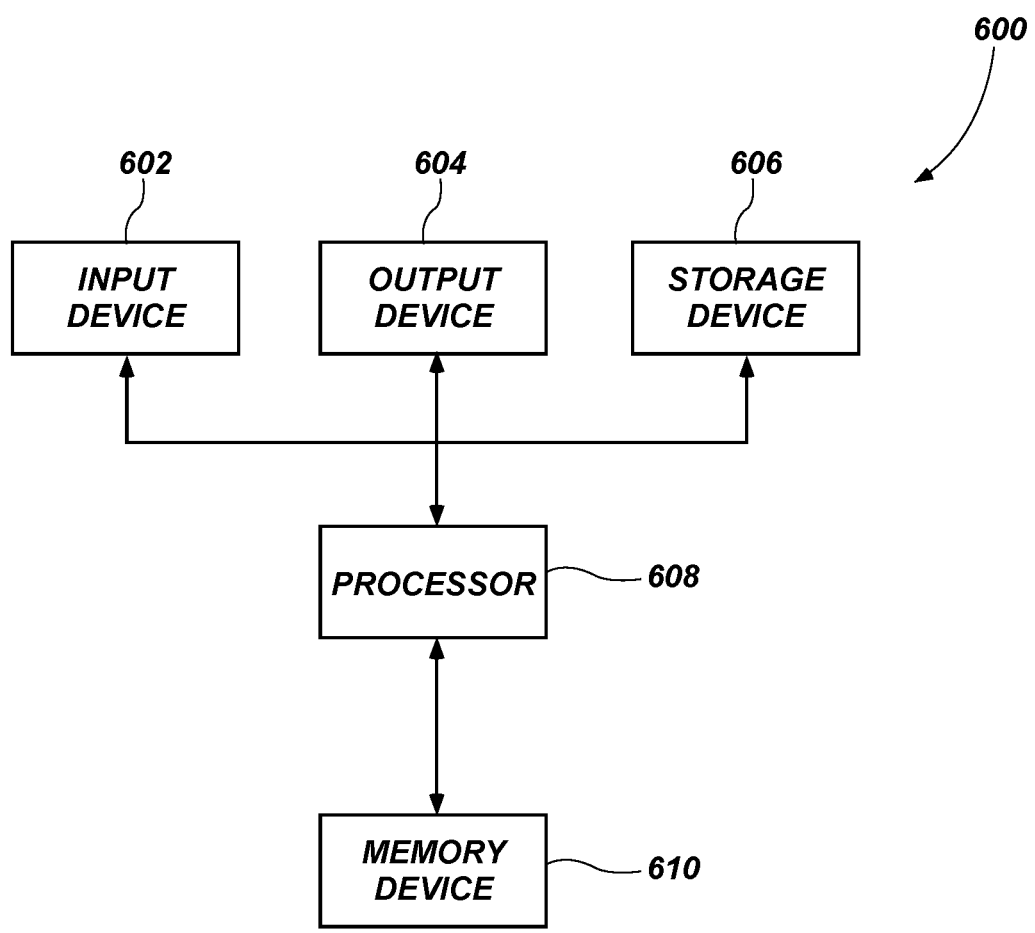
FIG. 13 is a simplified block diagram of a system implemented according to one or more embodiments described herein.

FIG. 13 illustrates a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker. The input device 602 and the output device 604 are not necessarily separable from one another. The system 600 also includes a storage device 606. The input device 602, output device 604, and storage device 606 are coupled to a conventional processor 608. The system 600 also includes a memory device 610 coupled to the processor 608. The memory device 610 includes at least one memory cell, such as a memory cell 100, according to one or more embodiments described herein. The memory device 610 may include an array of memory cells, such as conductive bridge RAM cells. The system 600 may be incorporated within a computing, processing, industrial, or consumer product. For example, without limitation, the system 600 may be included within a personal computer, a handheld device, a camera, a phone, a wireless device, a display, a chip set, a game, a vehicle, or other known systems.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A memory cell, comprising:
an ion-source material adjacent a cell material; and
a discontinuous interfacial material between the cell material and the ion-source material, the discontinuous interfacial material comprising atoms adherent to the cell material and adjacent atoms of the discontinuous interfacial material spaced by a distance greater than or equal to a diameter of ions of the ion-source material.

2. The memory cell of claim 1, wherein the discontinuous interfacial material comprises metal atoms.

3. The memory cell of claim 1, wherein the atoms adherent to the cell material comprise atoms chemisorbed to the cell material.

4. The memory cell of claim 1, wherein the atoms adherent to the cell material comprise a centralized atom and one or more ligands bonded to the centralized atom.

5. The memory cell of claim 1, wherein the atoms adherent to the cell material are bonded to at least one atom from the ion-source material.

6. The memory cell of claim 5, wherein the atoms adherent to the cell material are bonded to another atom bonded to the ion-source material.

7. The memory cell of claim 1, wherein the cell material comprises a material permeable to atoms of the ion-source material.

8. The memory cell of claim 1, wherein the cell material comprises a semiconductive chalcogenide solid-electrolyte.

9. A semiconductor device, comprising:
memory cells, at least one memory cell of the memory cells comprising:
an ion-source material over a cell material; and
a discontinuous interfacial material between the cell material and the ion-source material, the discontinuous interfacial material comprising interfacial complexes spaced apart by a distance greater than or equal to a diameter of ions of the ion-source material and the interfacial complexes comprising a partial monolayer of the discontinuous interfacial material.

10. The semiconductor device of claim 9, further comprising a first electrode and a second electrode in operative communication with the cell material and the ion-source material.

11. The semiconductor device of claim 10, wherein the first electrode comprises a single material.

12. The semiconductor device of claim 10, wherein the first electrode comprises more than one material.

13. The semiconductor device of claim 10, wherein metal atoms of the ion-source material electroconductively connect the first electrode and the second electrode.

14. The semiconductor device of claim 10, wherein metal atoms of the ion-source material electroconductively connect the first electrode and the ion-source material.

15. The semiconductor device of claim 9, wherein the ion-source material comprises a copper-containing material or a silver-containing material.

16. A method of operating a semiconductor device comprising:
applying a voltage to a semiconductor device comprising memory cells, at least one of the memory cells comprising an ion-source material over a cell material; and
diffusing ions from the ion-source material through a discontinuous interfacial material between the cell material and the ion-source material to form at least one conductive path between a first electrode and the ion-source material, the discontinuous interfacial material comprising atoms adherent to the cell material, adjacent atoms of the discontinuous interfacial material spaced by a distance greater than or equal to a diameter of the ions of the ion-source material, and the discontinuous interfacial material comprising a thickness of only one adherent atom.

17. The method of claim 16, wherein diffusing ions from the ion-source material through a discontinuous interfacial material comprises diffusing at least one of copper ions or silver ions through the discontinuous interfacial material.

18. The method of claim 16, wherein diffusing ions from the ion-source material through a discontinuous interfacial material between the cell material and the ion-source material comprises forming the at least one conductive path electroconductively connecting the first electrode and the ion-source material of the semiconductor device.

19. The method of claim 16, wherein diffusing ions from the ion-source material through a discontinuous interfacial material between the cell material and the ion-source material comprises forming the at least one conductive path electroconductively connecting the first electrode and a second electrode.

20. The method of claim 16, wherein forming at least one conductive path comprises switching a memory state of the memory cells from a high resistance state to a low resistance state.

21. The semiconductor device of claim 16, wherein forming at least one conductive path comprises forming a filament extending through the discontinuous interfacial material.

22. The method of claim 16, further comprising reversing a polarity of the voltage to dissipate the at least one conductive path.

* * * * *